US012283577B2

(12) United States Patent
Kim et al.

(10) Patent No.: US 12,283,577 B2
(45) Date of Patent: Apr. 22, 2025

(54) FAN-OUT SEMICONDUCTOR PACKAGE

(71) Applicant: Samsung Electronics Co., Ltd., Suwon-si (KR)

(72) Inventors: Joonsung Kim, Suwon-si (KR); Seokwon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 17/862,482

(22) Filed: Jul. 12, 2022

(65) Prior Publication Data

US 2023/0187424 A1    Jun. 15, 2023

(30) Foreign Application Priority Data

Dec. 10, 2021   (KR) .................. 10-2021-0176943

(51) Int. Cl.
*H01L 25/18*    (2023.01)
*H01L 23/00*    (2006.01)
(Continued)

(52) U.S. Cl.
CPC .............. *H01L 25/16* (2013.01); *H01L 23/13* (2013.01); *H01L 23/49838* (2013.01);
(Continued)

(58) Field of Classification Search
CPC ........... H01L 23/49838; H01L 23/5386; H01L 23/49833; H01L 23/5223; H01L 23/50; H01L 23/5389; H01L 2224/08225; H01L 2224/48225; H01L 2224/08265; H01L 25/16; H01L 25/162; H01L 25/105; H01L 25/00; H01L 25/18; H01L 25/0652; H01L 25/165; H01L 25/0655; H01L 25/0657; H01L 2924/1431; H01L 2924/1436; H01L 2924/1437; H01L 2924/1438; H01L 2924/182; H01L 2924/19041; H01L 2924/3011; H01L 28/90; H01L 24/24; H01L 2225/06541; H01L 2225/06548; H01G 4/1272

See application file for complete search history.

(56) References Cited

U.S. PATENT DOCUMENTS 9,620,482 B1   4/2017  Chen et al.
9,773,757 B2   9/2017  Yu et al.
(Continued)

*Primary Examiner* — Victor A Mandala
*Assistant Examiner* — Lawrence C Tynes, Jr.
(74) *Attorney, Agent, or Firm* — Muir Patent Law, PLLC

(57) ABSTRACT

A fan-out semiconductor package includes: a package body including a fan-in area corresponding to a through-hole located therein, a fan-out area surrounding the fan-in area, and a body interconnect structure arranged in the package body corresponding to the fan-out area; a fan-in chip structure located in the through-hole, the fan-in chip structure comprising a first chip, a capacitor chip arranged to be apart from the first chip, and a second chip disposed on both the first chip and the capacitor chip; a redistribution structure arranged on a bottom surface of the package body and a bottom surface of the fan-in chip structure and including a redistribution element extending to the fan-out area; and an interconnect via arranged on a top surface of the package body and electrically connected to the redistribution element in the fan-out area.

20 Claims, 27 Drawing Sheets

(51) Int. Cl.
  *H01L 23/13* (2006.01)
  *H01L 23/48* (2006.01)
  *H01L 23/498* (2006.01)
  *H01L 23/538* (2006.01)
  *H01L 25/16* (2023.01)
  *H01L 49/02* (2006.01)

(52) U.S. Cl.
  CPC .......... *H01L 23/5386* (2013.01); *H01L 24/08* (2013.01); *H01L 24/16* (2013.01); *H01L 25/162* (2013.01); *H01L 28/90* (2013.01); H01L 23/49816 (2013.01); H01L 23/49833 (2013.01); *H01L 24/48* (2013.01); H01L 2224/08146 (2013.01); H01L 2224/08225 (2013.01); H01L 2224/08265 (2013.01); H01L 2224/16227 (2013.01); H01L 2224/16238 (2013.01); H01L 2224/48225 (2013.01); H01L 2924/1431 (2013.01); H01L 2924/1436 (2013.01); H01L 2924/1437 (2013.01); H01L 2924/1438 (2013.01); H01L 2924/182 (2013.01); H01L 2924/19041 (2013.01); H01L 2924/3011 (2013.01); H01L 2924/3511 (2013.01)

(56)  References Cited

U.S. PATENT DOCUMENTS

| | | | |
|---|---|---|---|
| 10,636,773 | B2 | 4/2020 | Kuo et al. |
| 10,658,333 | B2 | 5/2020 | Chen et al. |
| 10,804,244 | B2 | 10/2020 | Jeng et al. |
| 10,867,966 | B2 | 12/2020 | Chen et al. |
| 2016/0056100 | A1* | 2/2016 | Yeh .................. H01L 23/49838 257/676 |
| 2018/0138127 | A1 | 5/2018 | Lee et al. |
| 2019/0279950 | A1* | 9/2019 | Kim .................. H01L 23/3114 |
| 2019/0393168 | A1* | 12/2019 | Park .................. H01L 23/562 |
| 2021/0098380 | A1 | 4/2021 | Chen et al. |
| 2021/0134749 | A1 | 5/2021 | Kuo et al. |
| 2021/0183762 | A1* | 6/2021 | Kim .................. H01L 25/105 |
| 2023/0178384 | A1* | 6/2023 | Park .................. H01L 21/561 257/30 |

\* cited by examiner

FAN-OUT SEMICONDUCTOR PACKAGE

CROSS-REFERENCE TO RELATED APPLICATION

This application is based on and claims priority under 35 U.S.C. § 119 to Korean Patent Application No. 10-2021-0176943, filed on Dec. 10, 2021, in the Korean Intellectual Property Office, the disclosure of which is incorporated by reference herein in its entirety.

BACKGROUND

The inventive concept relates to a semiconductor package, and more particularly, to a fan-out semiconductor package.

Demands for lightweight, compact packages are increasing as the electronics industry pushes for lighter weight, higher speed, more functions, and higher performance. To cope with the demands, fan-out semiconductor packages have been proposed. In addition, when a fan-out semiconductor package includes a plurality of chips, it is desirable to improve power characteristics and warpage characteristics.

SUMMARY

The inventive concept provides a fan-out semiconductor package capable of improving power characteristics and warpage characteristics.

According to an aspect of the inventive concept, a fan-out semiconductor package includes: a package body including a fan-in area corresponding to a through-hole located therein, a fan-out area surrounding the fan-in area, and a body interconnect structure arranged in the package body corresponding to the fan-out area; a fan-in chip structure located in the through-hole, the fan-in chip structure comprising a first chip, a capacitor chip arranged to be spaced apart from the first chip, and a second chip disposed on both the first chip and the capacitor chip; a redistribution structure arranged on a bottom surface of the package body and a bottom surface of the fan-in chip structure and including a redistribution element extending to the fan-out area; and an interconnect via arranged on a top surface of the package body and electrically connected to the redistribution element in the fan-out area.

According to another aspect of the inventive concept, a fan-out semiconductor package includes: a package body including a fan-in area corresponding to a through-hole located therein, a fan-out area surrounding the fan-in area, and a body interconnect structure arranged in the package body corresponding to the fan-out area; a fan-in chip structure located in the through-hole, the fan-in chip structure including a first chip, a capacitor chip arranged to be spaced apart from the first chip, a first encapsulation layer located between the first chip and the capacitor chip, and a second chip having a top surface bonded to top surfaces of both the first chip and the capacitor chip; a redistribution structure arranged on a bottom surface of the package body and a bottom surface of the first chip and including a redistribution element extending to the fan-out area; and an interconnect via arranged on a top surface of the package body and electrically connected to the redistribution element in the fan-out area.

According to another aspect of the inventive concept, a fan-out semiconductor package includes a lower package and an upper package stacked on the lower package. The lower package includes: a package body including a fan-in area corresponding to a through-hole located therein, a fan-out area surrounding the fan-in area, and a body interconnect structure arranged in the package body corresponding to the fan-out area; a fan-in chip structure located in the through-hole, the fan-in chip structure including a first chip, a capacitor chip arranged to be spaced apart from the first chip, and a second chip disposed on both the first chip and the capacitor chip; a redistribution structure arranged on a bottom surface of the package body and a bottom surface of the fan-in chip structure and including a redistribution element extending to the fan-out area; a first external connection terminal electrically connected to the redistribution structure on the bottom surface of the package body; and an interconnect via and an interconnect pad arranged on a top surface of the package body and electrically connected to the redistribution element in the fan-out area.

The upper package includes: an upper circuit board; an upper semiconductor chip mounted on the upper circuit board; and a second external connection terminal arranged on a bottom surface of the upper circuit board and electrically connected to the interconnect pad of the lower package.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
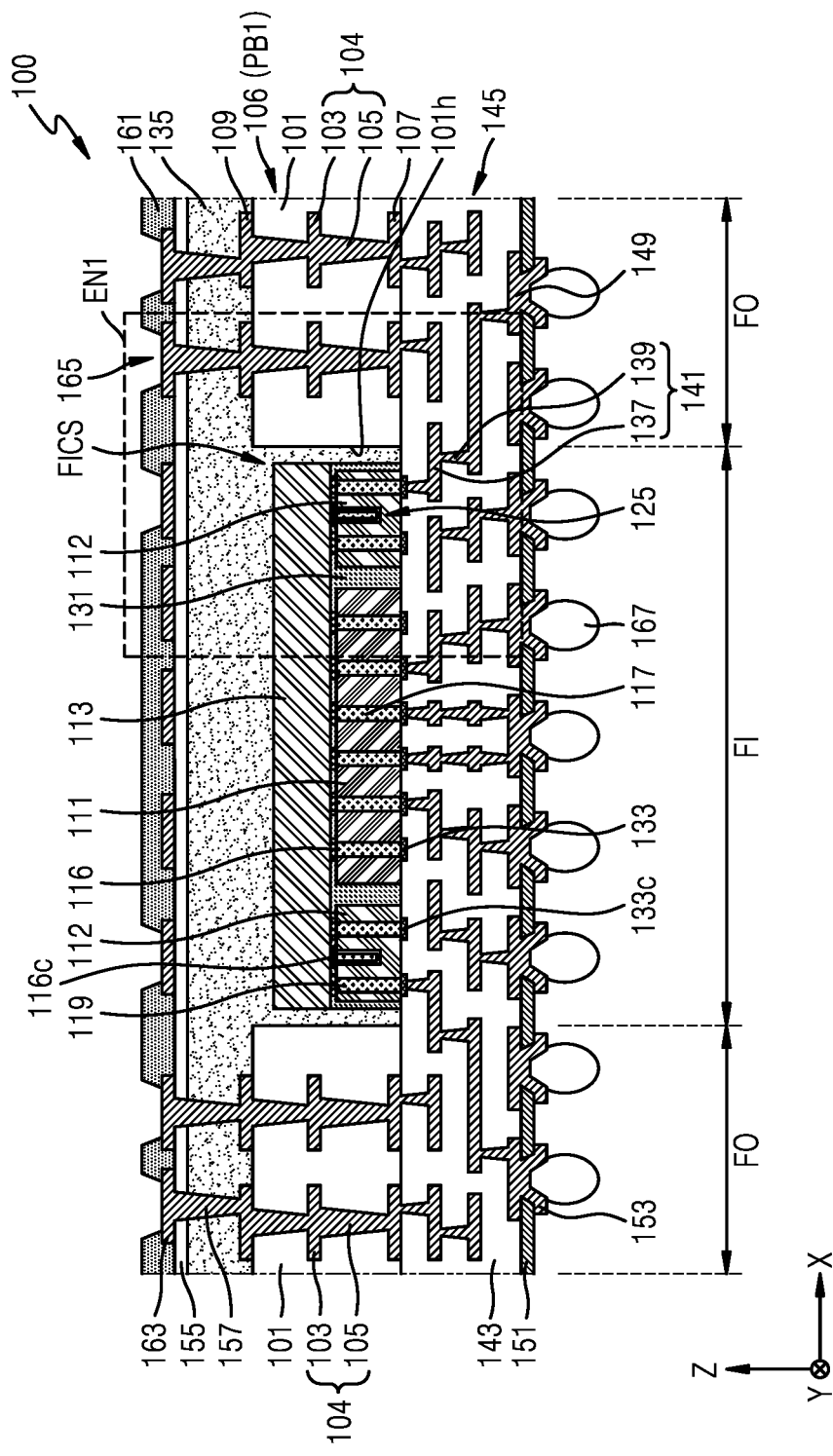
FIG. 1 is a cross-sectional view of a main part of a fan-out semiconductor package, according to an example embodiment of the inventive concept.

Hereinafter, embodiments of the inventive concept will be described in detail with reference to the accompanying drawings. Like reference numerals or symbols denote like elements in the figures, and repeated descriptions thereof will be briefly given or omitted herein.

Figure 2:
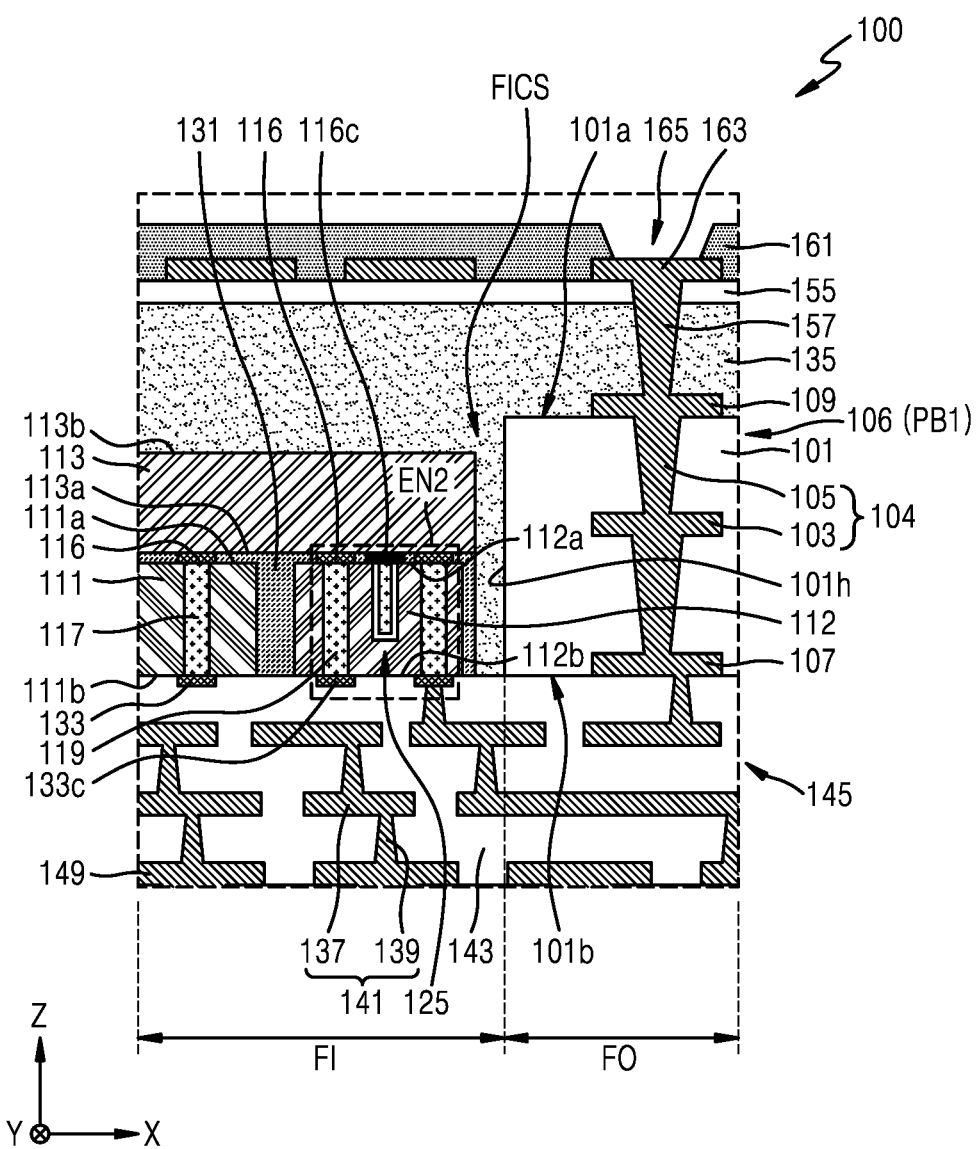
FIG. 2 is an enlarged view of a portion EN1 of FIG. 1.

FIG. 1 is a cross-sectional view of a main part of a fan-out semiconductor package 100 according to an example embodiment of the inventive concept, and FIG. 2 is an enlarged view of a portion "EN1" of FIG. 1.

In detail, the fan-out semiconductor package 100 may include a circuit board 106 including a fan-in area FI corresponding to a through-hole 101h located therein and a fan-out area FO arranged at either side of the fan-in area FI. The fan-out area FO may surround the fan-in area FI in a planar view.

The circuit board 106 may be a package body PB1. The circuit board 106 may be an insulating substrate. The circuit board 106 may be a wiring board. The circuit board 106 may be a printed circuit board (PCB). The circuit board 106 may be referred to as a frame substrate. The fan-out semiconductor package 100 may be a fan-out panel-level package (FOPLP)-type package. The circuit board 106 may include a body 101 positioned at either side of the through-hole 101h, body interconnect structures 104 arranged in the body 101, and body interconnect pads, i.e., first and second body interconnect pads 107 and 109.

The through-hole 101h may pass through top and bottom surfaces 101a and 101b of the body 101. The body 101 may be formed of at least one material selected from phenol resin, epoxy resin, and polyimide. For example, the body 101 may include at least one material from among flame retardant 4 (FR4), tetrafunctional epoxy, polyphenylene ether, epoxy/polyphenylene oxide, bismaleimide triazine (BT), thermount, cyanate ester, polyimide, and liquid crystal polymer.

Each body interconnect structure 104 may include body interconnect layers 103 formed in the body 101 and body vias 105 connecting the body interconnect layers 103 to each other. The body interconnect pads may consist of the first body interconnect pad 107 located in the bottom surface 101b of the body 101 and electrically connected to the body interconnect structure 104 and a second body interconnect pad 109 located on the top surface 101a of the body 101 and electrically connected to the body interconnect structure 104.

The first body interconnect pad 107 may be a portion of the body interconnect layer 103 positioned on the bottom surface 101b of the body 101. For example, a lower surface of the first body interconnect pad 107 may be coplanar with the bottom surface 101b of the body 101. The second body interconnect pad 109 may be a portion of the body interconnect layer 103 positioned on the top surface 101a of the body 101. For example, an upper surface of the second body interconnect pad 109 may be coplanar with the top surface 101a of the body 101.

The body interconnect layers 103, the body vias 105, and the first and second body interconnect pads 107 and 109 may each include a metal layer. For example, the body interconnect layers 103 and the first and second body interconnect pads 107 and 109 may be each formed of an electrolytically deposited (ED) copper (Cu) foil, a rolled-annealed (RA) Cu foil, a stainless steel foil, an aluminum (Al) foil, ultra-thin Cu foils, sputtered Cu, Cu alloys, or the like. For example, the body vias 105 may be formed of Cu, nickel (Ni), stainless steel, or beryllium copper (BeCu).

The fan-out semiconductor package 100 may include a fan-in chip structure FICS arranged in the through-hole 101h. The fan-in chip structure FICS may be referred to as a fan-in chip package structure. A portion of the body 101 of the circuit board 106, excluding the through-hole 101h, may correspond to the fan-out area FO. In some embodiments, a portion of the body 101 of the circuit board 106 corresponding to the fan-in chip structure FICS may correspond to the fan-in area FI.

In some embodiments, a top surface of the fan-in chip structure FICS may be at a lower level in the Z direction than a top surface of the circuit board 106. For example, the top surface of the fan-in chip structure FICS may be at a lower level in the Z direction than the top surface 101a of the body 101. The fan-in chip structure FICS may be embedded (or inserted) in the through-hole 101h.

The fan-in chip structure FICS may include a first chip 111, capacitor chips 112 arranged to be apart from the first chip 111, and a second chip 113 disposed on all of the first chip 111 and the capacitor chips 112. The fan-in chip structure FICS may be a stacked chip including the second chip 113 disposed on all of the first chip 111 and the capacitor chips 112.

The capacitor chips 112 may include a plurality of capacitor chips disposed on either side of the first chip 111. The capacitor chips 112 may be passive element chips where transistors or the like are not formed. Each of the capacitor chips 112 may have a smaller size (or length) than the first chip 111 and the second chip 113 in an X or Y direction. As described later, the second chip 113 may have a planar area that is greater than the sum of planar areas of the first chip 111 and the capacitor chips 112.

The first chip 111 and the capacitor chips 112 constituting the fan-in chip structure FICS may be arranged in the same plane within the through-hole 101h. The first chip 111 and the capacitor chips 112 may be each disposed at a bottom of the through-hole 101h or the bottom surface 101b of the body 101. A first encapsulation layer 131 may be positioned between the first chip 111 and each of the capacitor chips 112. The first encapsulation layer 131 may be formed of, for example, epoxy molding compound (EMC).

In some embodiments, the first chip 111 and the second chip 113 may each include individual devices. The individual devices may include various microelectronics devices, e.g., metal-oxide-semiconductor field effect transistors (MOSFETs), such as a complementary metal-oxide-semiconductor (CMOS) transistor, etc., system large scale integration (LSI) devices, image sensors, such as a CMOS image sensor (CIS), etc., micro-electro-mechanical systems (MEMS), active devices, passive devices, and the like.

In some embodiments, the first chip 111 is of a different type than the second chip 113. In some embodiments, the first chip 111 may be a memory chip, and the second chip 113 may be a logic chip. In some embodiments, the logic chip may be a memory controller chip, a central processing unit (CPU) chip, a graphics processing unit (GPU) chip, or an application processor (AP) chip.

In some embodiments, the memory chip may be a dynamic random access memory (DRAM) chip, a static RAM (SRAM) chip, a flash memory chip, an electrically erasable and programmable read-only memory (EEPROM) chip, a phase-change RAM (PRAM) chip, a magnetic RAM (MRAM) chip, or a resistive RAM (RRAM) chip.

The first chip 111 may have a top surface 111a and a bottom surface 111b. The top surface 111a of the first chip 111 may be an active surface on which individual devices are arranged, while the bottom surface 111b of the first chip 111 may be an inactive surface on which individual devices are not arranged. The top surface 111a of the first chip 111, which is the active surface, may face up.

The second chip 113 may have a top surface 113a and a bottom surface 113b. The top surface 113a of the second chip 113 may be an active surface on which individual devices are arranged, and the bottom surface 113b of the second chip 113 may be an inactive surface on which individual devices are not arranged. The top surface 113a of the second chip 113, which is the active surface, may face down. For example, the top surface 113a of the second chip 113 may face the top surface 111a of the first chip 111.

A second chip pad 116 may be disposed on the top surface 113a of the second chip 113. The second chip pad 116 may be a signal pad or a power pad. The top surface 111a of the first chip 111 may be bonded to the top surface 113a of the second chip 113 by using the second chip pad 116. For example, the second chip pad 116 may be in contact with the top surface 111a of the first chip 111 and the top surface 113a of the second chip 113. The first chip 111 may include a first through-via 117 penetrating between the top and bottom surfaces 111a and 111b of the first chip 111. For example, a top surface of the first through-via 117 may be coplanar with the top surface 111a of the first chip 111 and a bottom surface of the first through-via 117 may be coplanar with the bottom surface 111b of the first chip 111.

The first through-via 117 may be referred to as a first through-silicon via (TSV) or a first through conductive via. The first through-via 117 may be bonded to the second chip pad 116. The first through-via 117 may be electrically connected to the second chip pad 116. In some embodiments, the first through-via 117 may include a metal layer, for example, Cu, Al, tungsten (W), or the like.

A chip connection pad 133 may be disposed on the bottom surface 111b of the first chip 111. The chip connection pad 133 may be referred to as a lower chip connection pad. The chip connection pad 133 may be positioned on the bottom surface of the first through-via 117. The chip connection pad 133 may be electrically connected to the first through-via 117.

The chip connection pad 133 may be a signal pad or a power pad. In some embodiments, the chip connection pad 133 may be a redistribution pad formed during redistribution, and the chip connection pad 133 may be included in a redistribution structure 145 as described later. The chip connection pad 133 and the second chip pad 116 may be conductive pads that are electrically conductive.

In some embodiments, the chip connection pad 133 may have a different structure than the second chip pad 116. In some embodiments, the chip connection pad 133 may be a single-layered pad consisting of a copper layer, whereas the second chip pad 116 may be a triple-layered pad consisting of a Cu layer, a Ni layer, and a gold (Au) layer.

The capacitor chip 112 may have a top surface 112a and a bottom surface 112b. The top surface 112a of the capacitor chip 112 may be an active surface on which individual devices are arranged, while the bottom surface 112b of the capacitor chip 112 may be an inactive surface on which individual devices are not arranged. The top surface 112a of the capacitor chip 112, which is an active surface, may face up.

The capacitor chip 112 may include a second through-via 119 penetrating between the top and bottom surfaces 112a and 112b of the capacitor chip 112. For example, a top surface of the second through-via 119 may be coplanar with the top surface 112a of the capacitor chip 112 and a bottom surface of the second through-via 119 may be coplanar with the bottom surface 112b of the capacitor chip 112. The second through-via 119 may be referred to as a second TSV or a second through conductive via. The second through-via 119 may be bonded to the second chip pad 116. The second through-via 119 may be electrically connected to the second chip pad 116. In some embodiments, the second through-via 119 may include a metal layer, for example, Cu, Al, W, or the like.

A trench capacitor 125 may be formed adjacent to the top surface 112a of the capacitor chip 112. In some embodiments, the trench capacitor 125 may be formed adjacent to the bottom surface 112b of the capacitor chip 112. The second chip pad 116 may be disposed on the trench capacitor 125. The second chip pad 116 on the trench capacitor 125 among the second chip pads 116 may be referred to as an upper capacitor chip connection pad 116c.

In some embodiments, one of the second chip pads 116 may be electrically connected to the upper capacitor chip connection pad 116c. The upper capacitor chip connection pad 116c may be disposed on the trench capacitor 125. The upper capacitor chip connection pad 116c may be electrically connected to the trench capacitor 125. In some embodiments, the upper capacitor chip connection pad 116c may contact a top surface of the trench capacitor 125.

A lower capacitor chip connection pad 133c may be disposed on the bottom surface 112b of the capacitor chip 112. The lower capacitor chip connection pad 133c may be disposed on a bottom surface of the second through-via 119. The lower capacitor chip connection pad 133c may be electrically connected to the second through-via 119. In some embodiments, the lower capacitor chip connection pad 133c may contact the bottom surface of the second through-via 119. The lower capacitor chip connection pad 133c may be included in the redistribution structure 145 as described later.

Each of the upper and lower capacitor chip connection pads 116c and 133c may be formed of the same material as the second chip pad 116 and the chip connection pad 133, respectively. The capacitor chip 112 will be described in more detail below.

The fan-out semiconductor package 100 may include the redistribution structure 145. The redistribution structure 145 may be disposed on bottom surfaces of the circuit board 106 and the fan-in chip structure FICS. The redistribution structure 145 may include the chip connection pads 133 and the lower capacitor chip connection pads 133c. The redistribution structure 145 may extend to the fan-out area FO in a redistribution insulating layer 143 and include redistribution elements 141. Each redistribution element 141 may include a redistribution layer 137 and a redistribution via 139 connecting the redistribution layers 137.

The redistribution element 141 may be electrically connected to the chip connection pad 133 and the lower capacitor chip connection pad 133c in the fan-in area FI. The redistribution element 141 may be formed of the same material as the body interconnect structure 104.

The redistribution structure 145 may include redistribution pads 149 electrically connected to the redistribution element 141. Each of the redistribution pads 149 may be a portion of the redistribution layer 137 positioned on a top surface of the redistribution insulating layer 143. The redistribution pads 149 may be formed of the same material as the first and second body interconnect pads 107 and 109. A barrier metal layer 153, such as a Ni layer or a Cu layer, may be disposed on the redistribution pads 149. The barrier metal layer 153 may be electrically isolated by a first passivation layer 151.

The first passivation layer 151 may have a bottom surface that is the same surface as a bottom surface of the barrier metal layer 153. The redistribution pads 149 may be electrically isolated by the first passivation layer 151. First external connection terminals 167 such as solder balls may be arranged on the barrier metal layer 153.

The fan-out semiconductor package 100 may include a second encapsulation layer 135. The second encapsulation layer 135 may be disposed on the fan-in chip structure FICS embedded in the through-hole 101h and the circuit board 106. The second encapsulation layer 135 may surround top and side surfaces of the fan-in chip structure FICS. The second encapsulation layer 135 may hermetically seal the fan-in chip structure FICS located in the through-hole 101h.

The second encapsulation layer 135 may be formed along both sides of the fan-in chip structure FICS in the through-hole 101h. The second encapsulation layer 135 may encompass the fan-in chip structure FICS in the through-hole 101h in a planar view. For example, the second encapsulation layer 135 may be formed of EMC.

The fan-out semiconductor package 100 may include interconnect vias 157. The interconnect vias 157 may be disposed on the top surface 101a of the circuit board 106. In some embodiments, the interconnect vias 157 may be additionally and electrically insulated by an insulating layer 155. The insulating layer 155 may be formed on the second encapsulation layer 135 and may surround side surfaces of the interconnect vias 157. The interconnect vias 157 may be formed on the second body interconnect pad 109 in the fan-out area FO. The interconnect vias 157 may be electrically connected to the second body interconnect pad 109 in the fan-out area FO.

Each of the interconnect vias 157 may be electrically connected to the redistribution element 141 through the second body interconnect pads 109, the body interconnect structure 104, and the first body interconnect pads 107. The interconnect vias 157 may be formed of the same material as the body interconnect structure 104.

The fan-out semiconductor package 100 may include interconnect pads 163 respectively and electrically connected to the interconnect vias 157. The interconnect pads 163 may be electrically isolated by a second passivation layer 161. The interconnect pads 163 may be formed of the same material as the first and second body interconnect pads 107 and 109. The interconnect pads 163 may be exposed to outside through a pad exposure holes 165. A second external connection terminal (not shown), such as a second solder ball, may be disposed on each of the interconnect pads 163.

As described above, in the fan-out semiconductor package 100 of the present invention, the second chip 113 is attached to the first chip 111 by using the second chip pads 116 while maintaining a shortest distance therebetween, and the capacitor chips 112 are placed at either side of the first chip 111. Accordingly, the fan-out semiconductor package 100 may effectively supply power smoothly to both the first chip 111 and the second chip 113 and include the capacitor chips 112 to decrease impedance, thereby improving power characteristics.

In addition, in the fan-out semiconductor package 100 of the inventive concept, the capacitor chips 112 having a small size may be located below the second chip 113 so that a difference in a planar area between the second chip 113 and the capacitor chips 112 is reduced, thereby improving warpage characteristics.

Figure 3:
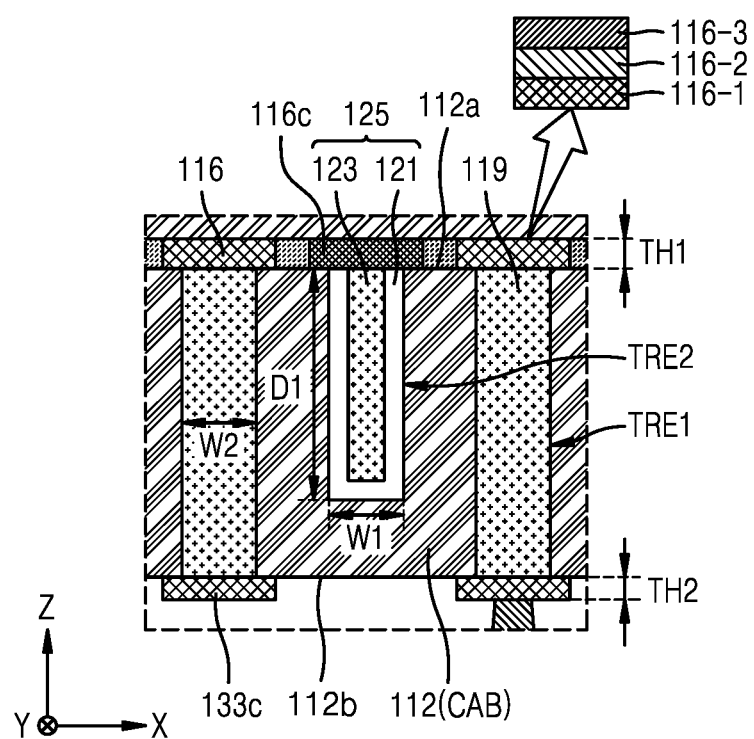
FIG. 3 is a cross-sectional view of a main part of a capacitor chip of a fan-out semiconductor package, according to an example embodiment of the inventive concept.

FIG. 3 is a cross-sectional view of a main part of the capacitor chip 112 of the fan-out semiconductor package 100, according to an example embodiment of the inventive concept.

In detail, FIG. 3 is an enlarged view of a portion "EN2" of FIG. 2. The capacitor chip 112 may have top and bottom surfaces 112a and 112b. The capacitor chip 112 may have a capacitor body CAB. The capacitor body CAB may include silicon (Si).

The capacitor chip 112 may include a trench capacitor 125. The trench capacitor 125 may include a dielectric layer 121 and a metal layer 123 formed in a trench TRE2 within the capacitor body CAB. The dielectric layer 121 may be conformally formed on side surfaces of the trench TRE2, and the metal layer 123 may fill a region formed by the dielectric layer 121. For example, the dielectric layer 121 may be a silicon oxide layer, and the metal layer 123 may be formed of Cu, Al, W, or the like.

The trench capacitor 125 may have a first width W1 and a first depth D1. For example, the first width W1 may be several to several tens of micrometers (μm), and the first depth D1 may be several tens to several hundreds of μm. An upper capacitor chip connection pad 116c may be disposed on the trench capacitor 125. The trench capacitor 125 may perform a function of a capacitor when a ground voltage and an operating voltage are respectively applied to the capacitor body CAB and the upper capacitor chip connection pad 116c.

A second through-via 119 may be formed in a trench TRE1 passing through the top and bottom surfaces 112a and 112b of the capacitor chip 112 within the capacitor body CAB. The second through-via 119 may have a second width W2. In some embodiments, the second width W2 may be equal to the first width W1. For example, the second width W2 may be several to several tens of μm.

The second through-via 119 may be bonded to the second chip pad 116 on the top surface 112a of the capacitor chip 112. The second chip pad 116 may have a first thickness TH1. In some embodiments, the second chip pad 116 may be a triple-layered pad including a Cu layer 116-1, a Ni layer 116-2, and an Au layer 116-3. The first thickness TH1 of the second chip pad 116 may be several tens of μm. When the second chip pad 116 is formed as a triple-layered pad, the second chip (113 of FIG. 1) may be easily bonded to the first chip (111 of FIG. 1).

The second through-via 119 may be bonded to a lower capacitor chip connection pad 133c on the bottom surface 112b of the capacitor chip 112. The lower capacitor chip connection pad 133c may have a different structure and a different thickness than those of the second chip pad 116. In some embodiments, the lower capacitor chip connection pad 133c may be a single-layered pad including a Cu layer.

The lower capacitor chip connection pad 133c may have a second thickness TH2 that is less than the first thickness TH1. In some embodiments, the second thickness TH2 of the lower capacitor chip connection pad 133c may be on the order of several μm. When the lower capacitor chip connection pad 133c and the chip connection pad (e.g., chip connection pad 133 of FIG. 1) are each formed as a single-layered pad, an interconnect resistance of the redistribution structure (e.g., redistribution structure 145 of FIG. 1) may be reduced.

Figure 4:
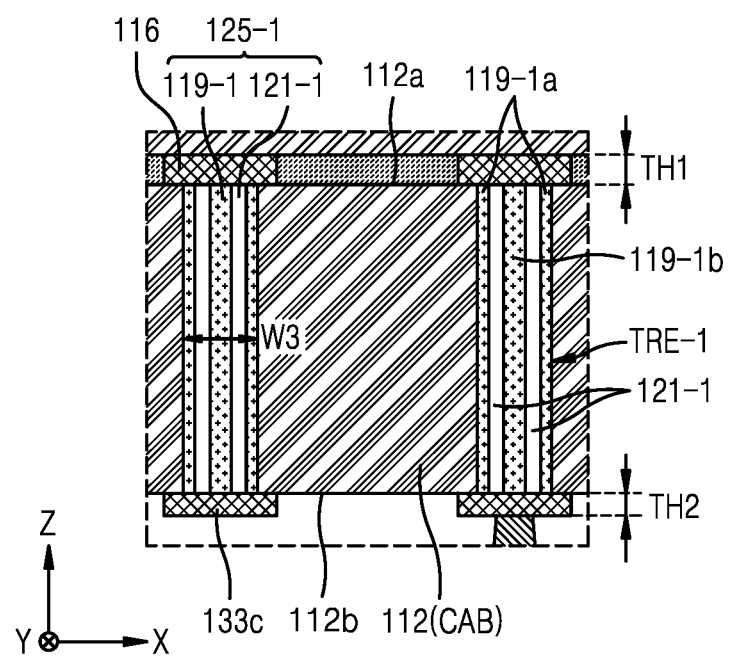
FIG. 4 is a cross-sectional view of a main part of a capacitor chip in a fan-out semiconductor package, according to an example embodiment of the inventive concept.

FIG. 4 is a cross-sectional view of a main part of a capacitor chip 112 in the fan-out semiconductor package 100, according to an example embodiment of the inventive concept.

In detail, FIG. 4 may show a modified embodiment of the portion "EN2" of FIG. 2. The capacitor chip 112 of FIG. 4 may be the same as the capacitor chip 112 of FIG. 3 except that the capacitor chip 112 of FIG. 4 includes a through-via capacitor 125-1 instead of a trench capacitor. In FIG. 4, the same or similar reference numerals as those of FIG. 3 denote the same or similar elements. Descriptions that are already provided above with respect to FIGS. 1 and 2 will be briefly given or omitted below.

The capacitor chip 112 may include a through-via capacitor 125-1. The through-via capacitor 125-1 may include a dielectric layer 121-1 and a second through-via 119-1 formed in a trench TRE-1 within the capacitor body CAB.

The through-via capacitor 125-1 may include a first sub through-via 119-1a formed on inner walls of the trench TRE-1, the dielectric layer 121-1 formed on inner walls of the first sub through-via 119-1a, and a second sub through-via 119-1b formed on inner walls of the dielectric layer 121-1.

The second through-via 119-1 may include the first and second sub through-vias 119-1a and 119-1b. The dielectric layer 121-1 may be provided between the first and second sub through-vias 119-1a and 119-1b. In some embodiments, the second through-via 119-1 may include a metal layer, for example, Cu, Al, W, or the like, and the dielectric layer 121-1 may include a silicon oxide layer.

The through-via capacitor 125-1 may have a third width W3. For example, the third width W3 may be several to several tens of μm. The third width W3 may be equal to the second width W2 of FIG. 2.

The through-via capacitor 125-1 may be bonded to the second chip pad 116 on the top surface 112a of the capacitor chip 112. The second chip pad 116 may have a first thickness TH1. The through-via capacitor 125-1 may be bonded to the lower capacitor chip connection pad 133c on the bottom surface 112b of the capacitor chip 112. The lower capacitor chip connection pad 133c may have a different structure and a different thickness than those of the second chip pad 116.

Figure 5:
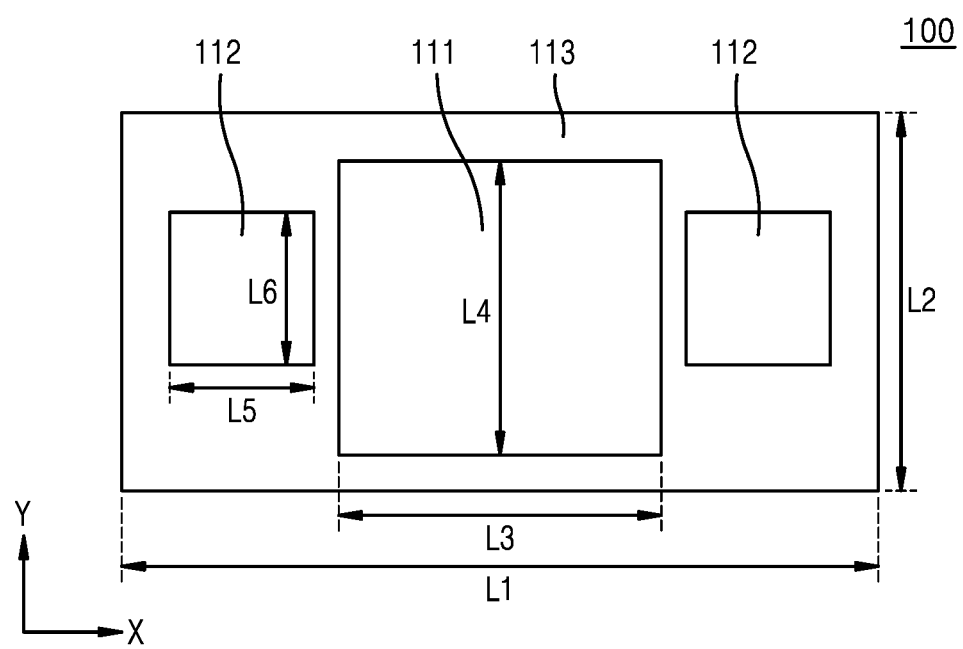
FIG. 5 is a layout diagram of a fan-out semiconductor package, according to an example embodiment of the inventive concept.

FIG. 5 illustrates a layout of a fan-out semiconductor package according to an example embodiment of the inventive concept.

In detail, FIG. 5 illustrates a layout of the fan-out semiconductor package 100 of FIG. 1. The fan-out semiconductor package 100 may include a first chip 111 and capacitor chips 112 arranged at either side of the first chip 111 to be apart therefrom.

The first chip 111 may have a third length L3 and a fourth length L4 in the X and Y directions, respectively. Each of the capacitor chips 112 may have a fifth length L5 and a sixth length L6 in the X and Y directions, respectively.

The second chip 113 may be disposed on all of the first chip 111 and the capacitor chips 112. The first chip 111 and the capacitor chips 112 may be arranged to overlap each other inside the second chip 113 in a planar view. The second chip 113 may have a first length L1 and a second length L2 in the X and Y directions, respectively. In some embodiments, each of the first through sixth lengths L1 through L6 may be several to several tens of millimeters (mm).

In the fan-out semiconductor package 100, a planar area of the second chip 113, i.e., the value of L1×L2, may be greater than a sum of a planar area of the first chip 111, i.e., the value of L3×L4, and planar areas of the capacitor chips 112, i.e., twice the value of L5×L6 (2×L5×L6). In some embodiments, in the fan-out semiconductor package 100, the sum of the planar area of the first chip 111, i.e., the value of L3×L4, and the planar areas of the capacitor chips 112, i.e., the value of 2×L5×L6, may be 50% to 95% of the planar area of the second chip 113, i.e., the value of L1×L2. As described above, the fan-out semiconductor package 100 may provide improved warpage characteristics by adjusting a difference between the planar area of the second chip 113 and the sum of the planar areas of the first chip 111 and the capacitor chips 112.

Figure 6:
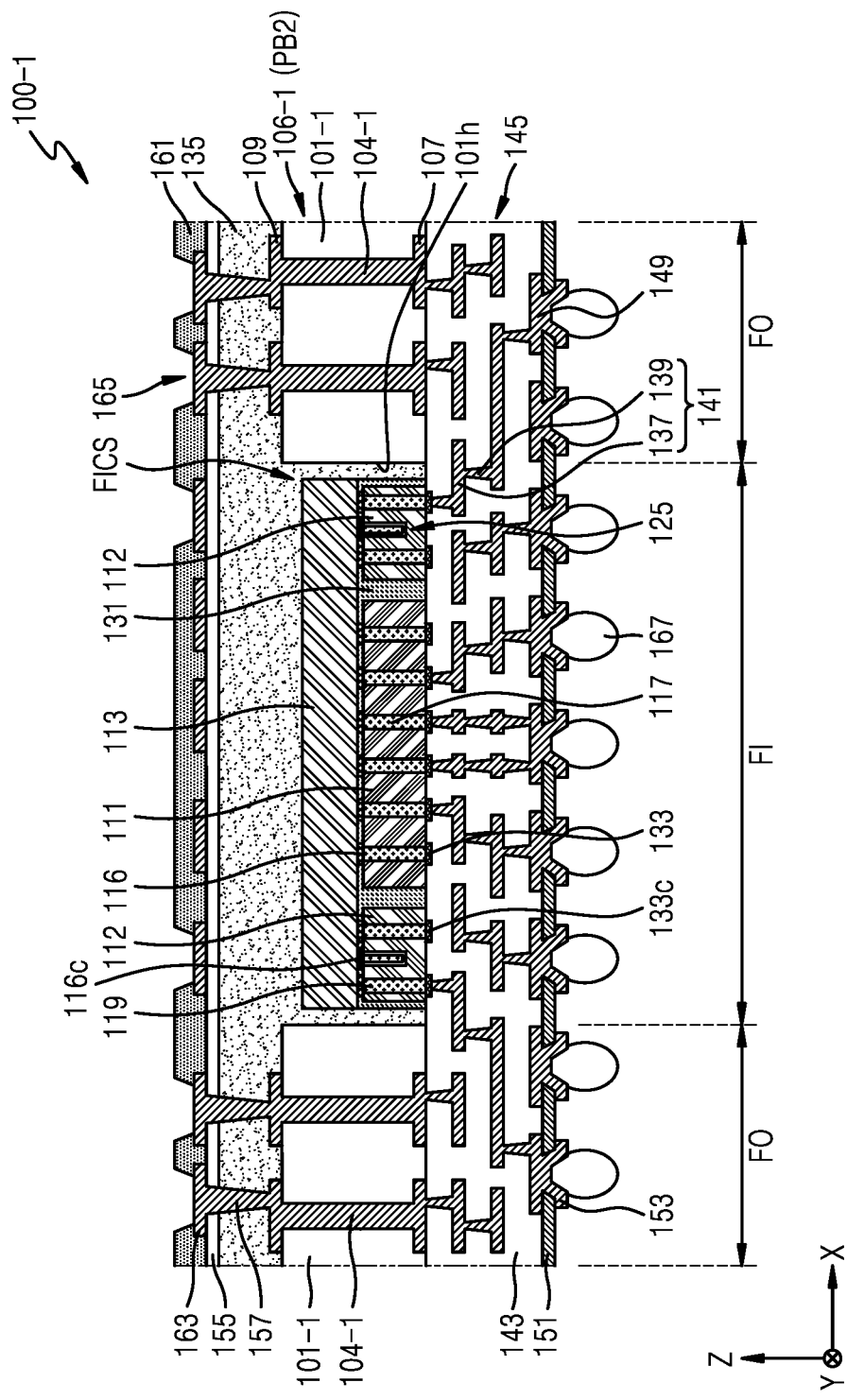
FIG. 6 is a cross-sectional view of a main part of a fan-out semiconductor package, according to an example embodiment of the inventive concept.

FIG. 6 is a cross-sectional view of a main part of a fan-out semiconductor package 100-1 according to an example embodiment of the inventive concept.

In detail, the fan-out semiconductor package 100-1 may be substantially the same as the fan-out semiconductor package 100 of FIGS. 1 and 2, except that the circuit board 106-1 is different from the circuit board 106. In FIG. 6, the same or similar reference numerals as those of FIGS. 1 and 2 denote the same or similar elements. Descriptions that are already provided above with respect to FIGS. 1 and 2 will be briefly given or omitted below.

The fan-out semiconductor package 100-1 includes the circuit board 106-1. The circuit board 106-1 may be a package body PB2. The circuit board 106-1 may be a semiconductor substrate. The circuit board 106-1 may be referred to as an interposer substrate. The fan-out semiconductor package 100-1 may be a fan-out wafer level package (FOWLP)-type package. The circuit board 106-1 may include a body 101-1, body interconnect structures 104-1 arranged in the body 101-1, and first and second body interconnect pads 107 and 109.

The body 101-1 may include a semiconductor material, e.g., a semiconductor element, such as Si or germanium (Ge), or a compound semiconductor, such as silicon carbide (SiC), gallium arsenide (GaAs), indium arsenide (InAs), and indium phosphide (InP).

Each body interconnect structure 104-1 may include a body via layer formed in the body 101-1. The body interconnect structure 104-1 may include a metal layer, for example, Cu. An upper portion of the body interconnect structure 104-1 may have a width equal to that of a lower portion thereof. As described above, the fan-out semiconductor package 100-1 may use a semiconductor substrate as the circuit board 106-1.

Figure 7:
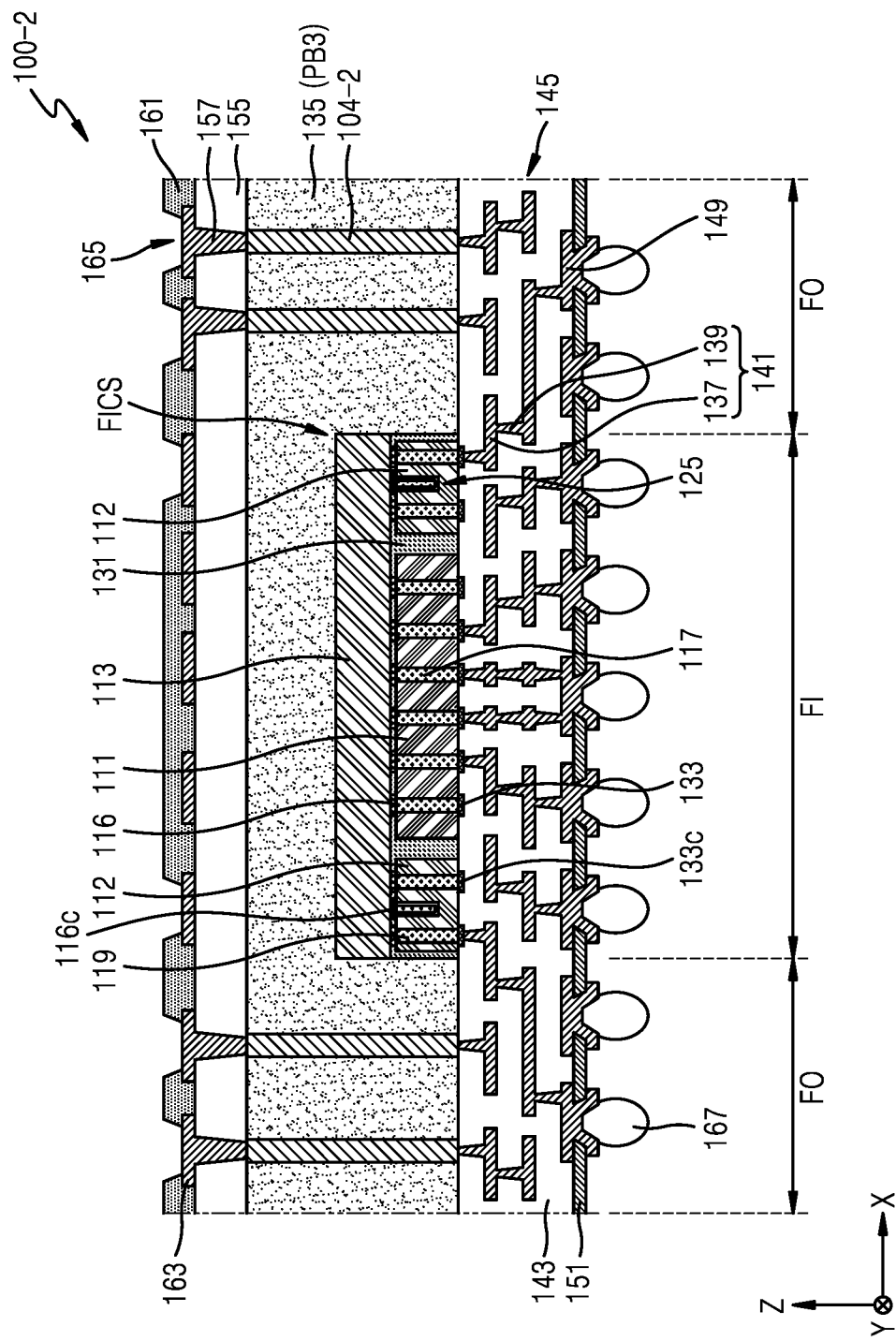
FIG. 7 is a cross-sectional view of a main part of a fan-out semiconductor package, according to an example embodiment of the inventive concept.

FIG. 7 is a cross-sectional view of a main part of a fan-out semiconductor package 100-2 according to an example embodiment of the inventive concept.

In detail, the fan-out semiconductor package 100-2 may be substantially the same as the fan-out semiconductor package 100 of FIGS. 1 and 2 except for a package body PB3 and body interconnect structures 104-2. In FIG. 7, the same or similar reference numerals as those of FIGS. 1 and 2 denote the same or similar elements. Descriptions that are already provided above with respect to FIGS. 1 and 2 will be briefly given or omitted below.

The fan-out semiconductor package 100-2 includes a second encapsulation layer 135. The second encapsulation layer 135 may be the package body PB3. The fan-out semiconductor package 100-2 may be an FOWLP-type package.

The body interconnect structures 104-2 may be arranged in the second encapsulation layer 135. Each body interconnect structure 104-2 may include a metal post layer, for example, a Cu post layer. An insulating layer 155 may be disposed on the second encapsulation layer 135 to insulate interconnect vias 157. The insulating layer 155 in the fan-out semiconductor package 100-2 in FIG. 7 is formed to be slightly thicker than the insulating layer 155 in the fan-out semiconductor package 100 of FIGS. 1 and 2. As described above, the fan-out semiconductor package 100-2 may use the second encapsulation layer 135 as the package body PB3.

Figure 8:
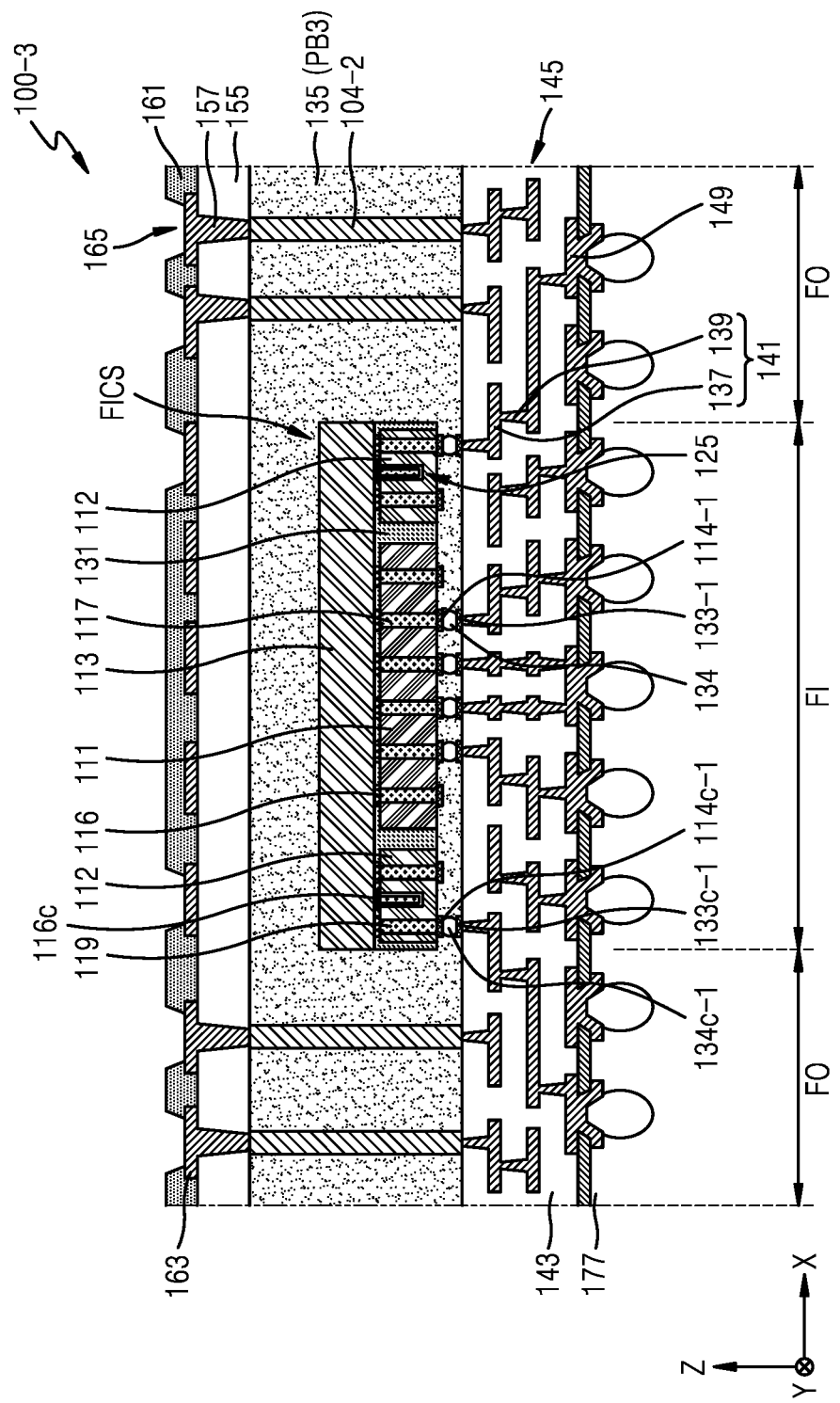
FIG. 8 is a cross-sectional view of a main part of a fan-out semiconductor package, according to an example embodiment of the inventive concept.

FIG. 8 is a cross-sectional view of a main part of a fan-out semiconductor package 100-3 according to an example embodiment of the inventive concept.

In detail, the fan-out semiconductor package 100-3 may be substantially the same as the fan-out semiconductor package 100-2 of FIG. 7, except for a connection relationship between a fan-in chip structure FICS and a redistribution structure 145. In FIG. 8, the same or similar reference numerals as those of FIGS. 1 and 2 denote the same or similar elements. Descriptions that are already provided above with respect to FIGS. 1, 2, and 7 will be briefly given or omitted below.

In the fan-out semiconductor package 100-3, a first chip 111 includes lower first chip pads 114-1, and capacitor chips 112 include lower capacitor chip pads 114c-1. In the fan-out semiconductor package 100-3, chip connection pads 133-1 may be positioned on a portion of the redistribution structure 145 underlying the first chip 111, and lower capacitor chip connection pads 133c-1 may be positioned on a portion of the redistribution structure 145 underlying the capacitor chips 112.

The chip connection pads 133-1 on the redistribution structure 145 may be electrically connected to the lower first chip pads 114-1 by using intermediate solder balls 134. The lower capacitor chip connection pads 133c-1 on the redistribution structure 145 may be electrically connected to the lower capacitor chip pads 114c-1 by using intermediate solder balls 134c-1.

As described above, in the fan-out semiconductor package 100-3, the fan-in chip structure FICS may be easily connected to the redistribution structure 145 by using the intermediate solder balls 134 and 134c-1.

Figure 9:
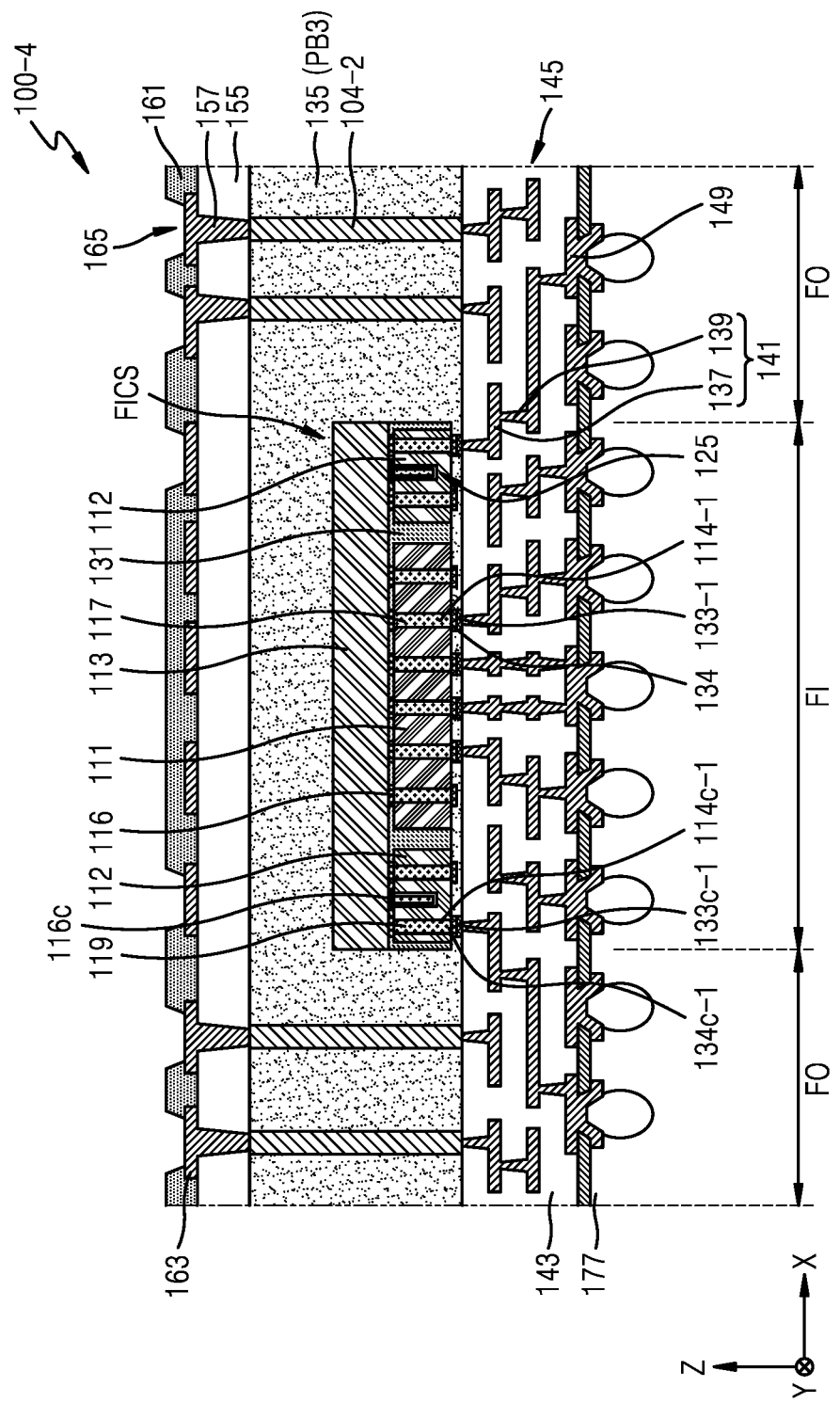
FIG. 9 is a cross-sectional view of a main part of a fan-out semiconductor package, according to an example embodiment of the inventive concept.

FIG. 9 is a cross-sectional view of a main part of a fan-out semiconductor package 100-4 according to an example embodiment of the inventive concept.

In detail, the fan-out semiconductor package 100-4 may be substantially the same as the fan-out semiconductor package 100-3 of FIG. 8 except for a connection relationship between the fan-in chip structure FICS and the redistribution structure 145. In FIG. 9, the same or similar reference numerals as those of FIGS. 1, 2, and 8 denote the same or similar elements. Descriptions that are already provided above with respect to FIGS. 1, 2, and 8 will be briefly given or omitted below.

In the fan-out semiconductor package 100-4, the first chip 111 includes the lower first chip pads 114-1, and the capacitor chips 112 include the lower capacitor chip pads 114c-1.

In the fan-out semiconductor package 100-3, the chip connection pads 133-1 may be positioned on a portion of the redistribution structure 145 underlying the first chip 111, and the lower capacitor chip connection pads 133c-1 may be positioned on a portion of the redistribution structure 145 underlying the capacitor chips 112.

The chip connection pads 133-1 on the redistribution structure 145 may be directly bonded to the lower first chip pads 114-1 for electrical connection. The lower capacitor chip connection pad 133c-1 on the redistribution structure 145 may be directly bonded to the lower capacitor chip pads 114c-1 for electrical connection.

As described above, in the fan-out semiconductor package 100-3, the fan-in chip structure FICS may be easily connected to the redistribution structure 145 by directly bonding the fan-in chip structure FICS thereto.

Figure 10A:
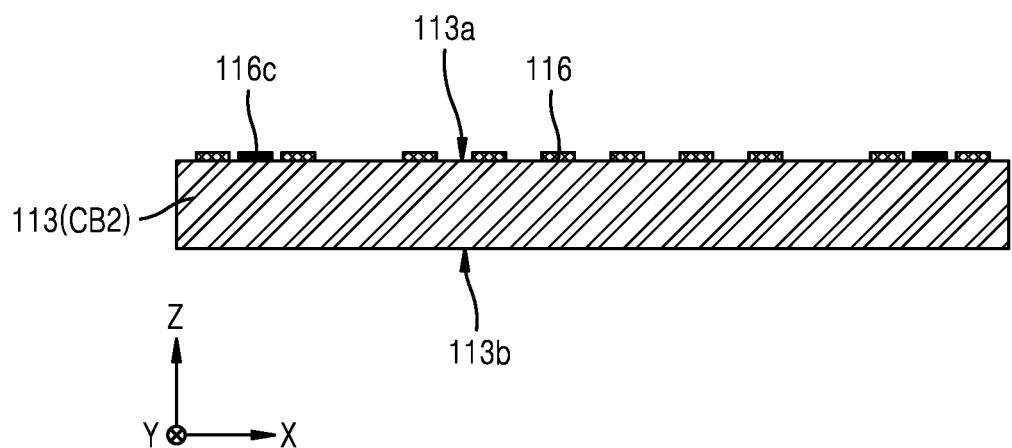
FIGS. 10A through 10C are cross-sectional views of main parts for explaining a method of manufacturing a fan-in chip structure (FICS) in the fan-out semiconductor package of FIGS. 1 and 2, according to an example embodiment.
Figure 10B:
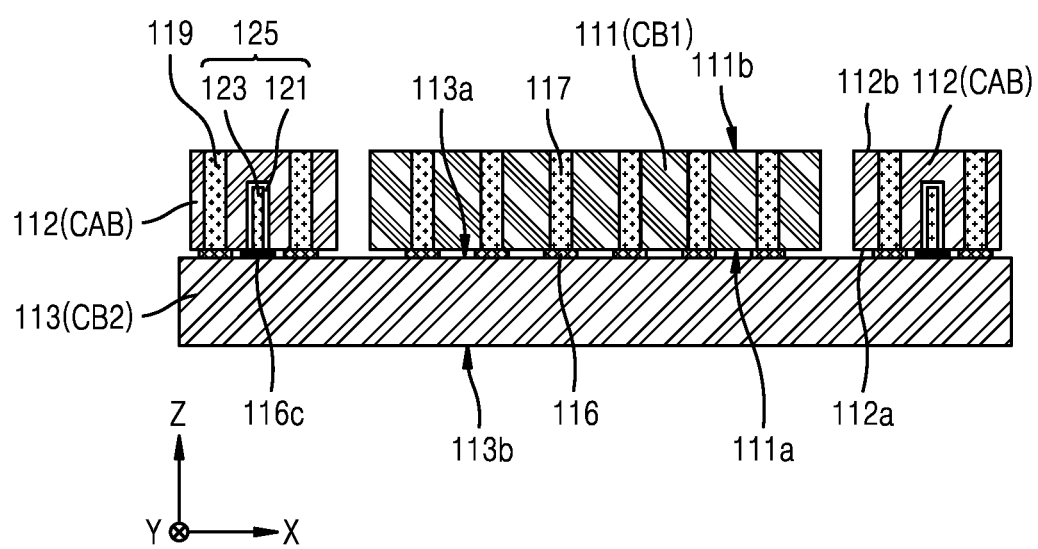
Figure 10C:
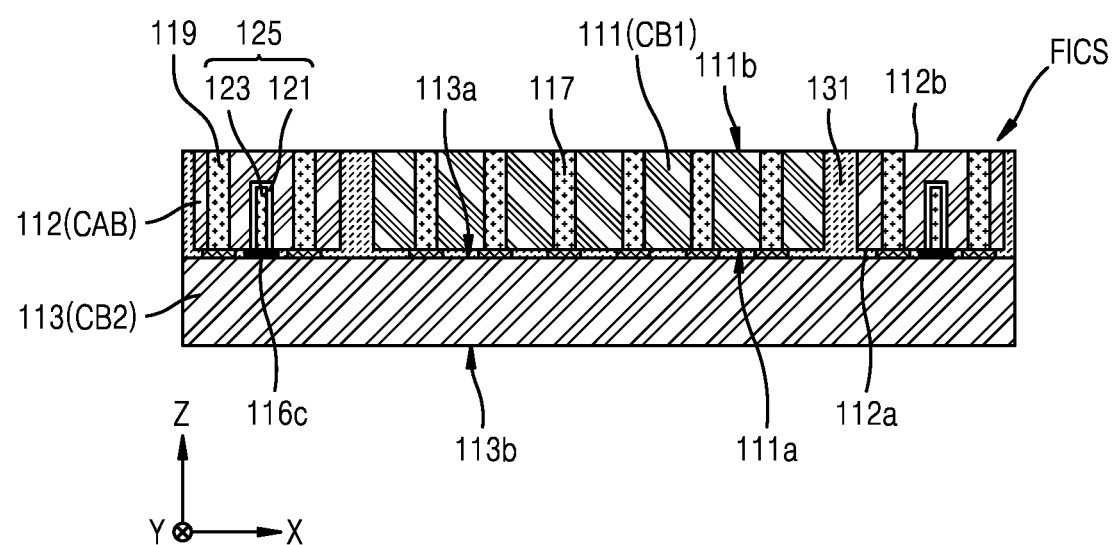

FIGS. 10A through 10C are cross-sectional views of main parts for explaining a method of manufacturing a fan-in chip structure FICS in the fan-out semiconductor package 100 of FIGS. 1 and 2, according to an example embodiment.

In detail, FIGS. 10A through 10C are cross-sectional views for explaining a method of manufacturing the fan-in chip structure FICS of FIGS. 1 and 2. In FIGS. 10A through 10C, the same or similar reference numerals as those of FIGS. 1 and 2 denote the same or similar elements. Descriptions that are already provided above with respect to FIGS. 1 and 2 will be briefly given or omitted below.

Referring to FIG. 10A, the second chip 113 is prepared. The second chip 113 may have the top surface 113a and the bottom surface 113b. The second chip 113 may include a second chip body CB2. The second chip body CB2 may include Si.

As described above, the top surface 113a may be an active surface on which individual devices are arranged, and the bottom surface 113b may be an inactive surface on which individual devices are not arranged. FIG. 10A shows that the second chip 113 has the top surface 113a, which is the active surface, facing up. The second chip pads 116 may be disposed on the top surface 113a of the second chip 113. The second chip pads 116 may include the upper capacitor chip connection pads 116c that are later bonded to the trench capacitor 125.

Referring to FIG. 10B, the first chip 111 and the capacitor chips 112 are mounted on the second chip 113. The first chip 111 is mounted on a central portion of the second chip 113. The first chip 111 may have the top surface 111a and the bottom surface 111b. The first chip 111 may include a first chip body CB1. The first chip body CB1 may include Si.

The top surface 111a may be an active surface on which individual devices are arranged, while the bottom surface 111b may be an inactive surface on which individual devices are not arranged. The top surface 111a of the first chip 111, which is the active surface, may face down.

The first chip 111 may be mounted with the top surface 111a that is the active surface facing the top surface 113a of the second chip 113 that is the active surface. The first chip 111 may include the first through-via 117 penetrating between the top and bottom surfaces 111a and 111b of the first chip body CB1. The second chip pad 116 on the second chip 113 may be bonded to the first through-via 117 in the first chip 111.

The capacitor chips 112 are mounted at either side of the second chip 113 to be spaced apart from the second chip 113. The capacitor chip 112 may have the top and bottom surfaces 112a and 112b. The capacitor chip 12 may have a capacitor body CAB. The capacitor body CAB may include Si.

The top surface 112a may be an active surface on which individual devices are arranged, while the bottom surface 112b may be an inactive surface on which individual devices are not arranged. The top surface 112a of the capacitor chip 112, which is the active surface, may face down. The capacitor chip 112 may include a trench capacitor 125. The trench capacitor 125 may include the dielectric layer 121 and the metal layer 123 formed in the capacitor body CAB. The capacitor chip 112 may include the second through-via 119 penetrating between the top and bottom surfaces 112a and 112b of the capacitor body CAB.

The capacitor chip 112 may be mounted with the top surface 112a that is the active surface facing the top surface 113a of the second chip 113 that is the active surface. The upper capacitor chip connection pad 116c on the second chip 113 may be bonded to the second through-via 119 of the capacitor chip 112.

Referring to FIG. 10C, after mounting the first chip 111 and the capacitor chips 112 on the second chip 113 as described above, the first encapsulation layer 131 is formed between the first chip 111 and each of the capacitor chips 112 on the second chip 113.

The first encapsulation layer 131 may be formed between the second chip pads 116 on the second chip 113 and between the upper capacitor chip connection pads 116c. The first encapsulation layer 131 is formed between the first chip 111 and each of the capacitor chips 112 and on the second chip 113.

A top (surface) of the first encapsulation layer 131 may be coplanar with the bottom surface 111b of the first chip 111 and the bottom surface 112b of the capacitor chip 112. Through this process, the fan-in chip structure FICS described above may be manufactured.

Figure 11:
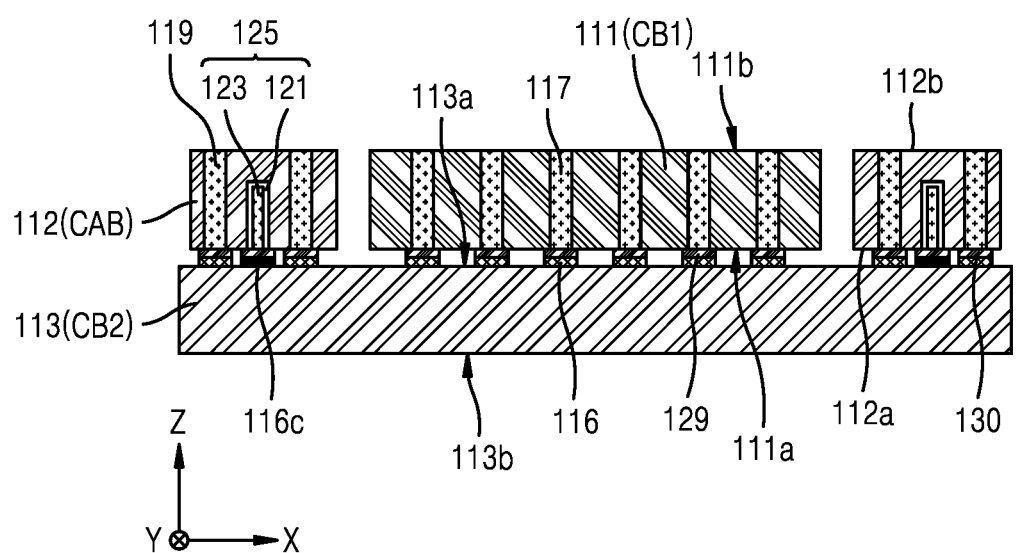
FIG. 11 is a cross-sectional view of a main part for explaining a method of manufacturing a fan-in chip structure (FICS) in a fan-out semiconductor package, according to an example embodiment.

FIG. 11 is a cross-sectional view of a main part for explaining a method of manufacturing a fan-in chip structure FICS in a fan-out semiconductor package, according to an example embodiment.

In detail, FIG. 11 may show a modified example of FIG. 10B. FIG. 11 may show a modified example in which the first chip 111 and the capacitor chips 112 are mounted on the second chip 113. In FIG. 11, the same or similar reference numerals as those of FIGS. 10A through 10C denote the same or similar elements. Descriptions that are already provided above with respect to FIGS. 10A through 10C will be briefly given or omitted below.

As shown in FIG. 11, in the first chip 111, upper first chip pads 129 may be formed on the top surface 111a of the first chip body CB1. The first chip 111 may be mounted with the top surface 111a that is the active surface facing the top surface 113a of the second chip 113 that is the active surface.

The first chip 111 may include the first through-via 117 penetrating between the top and bottom surfaces 111a and 111b of the first chip body CB1. The second chip pads 116 on the second chip 113 may be bonded to the upper first chip pads 129 on the first chip 111.

In the capacitor chip 112, upper capacitor chip pads 130 may be further formed on the top surface 111a of the capacitor body CAB. The first chip 111 may be mounted with the top surface 111a that is the active surface facing the top surface 112a of the capacitor chip 112 that is the active surface.

The capacitor chip 112 may include the second through-via 119 penetrating between the top and bottom surfaces 111a and 111b of the capacitor body CAB. The upper capacitor chip connection pads 116c on the second chip 113 may be bonded to the upper capacitor chip pads 130 on the capacitor chip 112.

Subsequently, as shown in FIG. 10C, after mounting the first chip 111 and the capacitor chips 112 on the second chip 113, the fan-in chip structure FICS may be manufactured by forming the first encapsulation layer 131 between the first chip 111 and each of the capacitor chips 112 on the second chip 113.

FIGS. 12 through 16 are cross-sectional views of main parts for explaining a method of manufacturing the fan-out semiconductor package 100 of FIGS. 1 and 2, according to an example embodiment.

In detail, in FIGS. 12 through 16, the same or similar reference numerals as those of FIGS. 1 and 2 denote the same or similar elements. Descriptions that are already provided above with respect to FIGS. 1 and 2 will be briefly given or omitted below.

Figure 12:
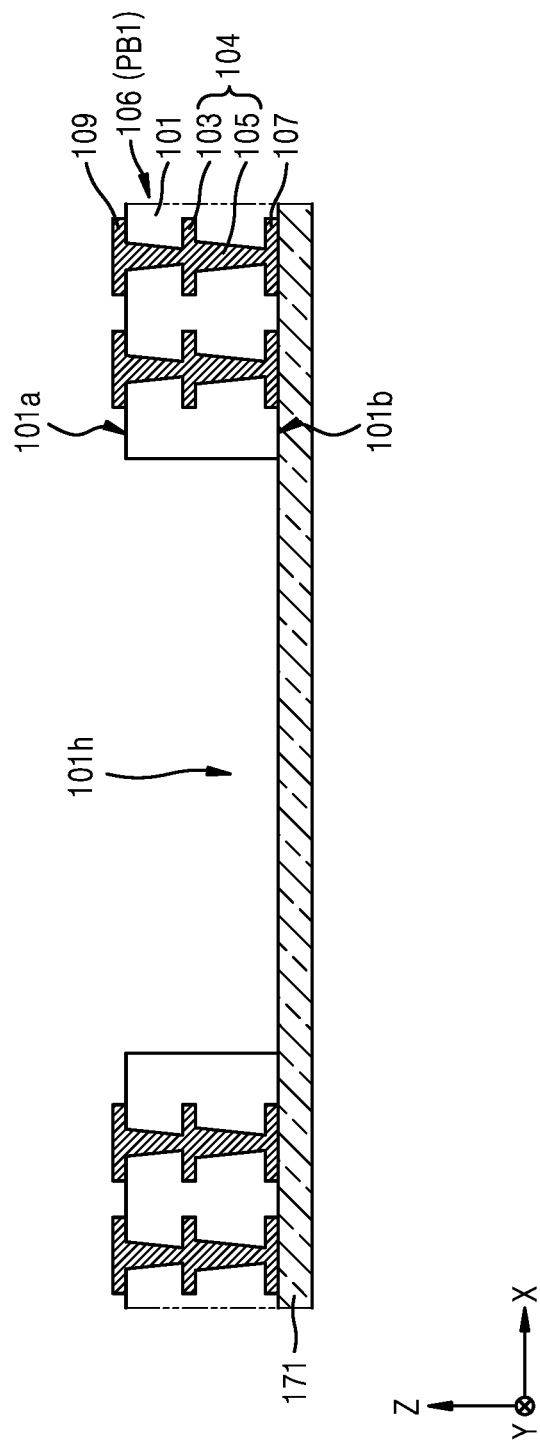
FIGS. 12 through 16 are cross-sectional views of main parts for explaining a method of manufacturing the fan-out semiconductor package of FIGS. 1 and 2, according to an example embodiment.

Referring to FIG. 12, the circuit board 106 having the through-hole 101h therein is prepared. The circuit board 106 constitutes the package body PB1. The circuit board 106 may be an insulating substrate. The circuit board 106 may include the body 101 positioned at either side of the through-hole 101h, the body interconnect structures 104 arranged in the body 101, and the first and second body interconnect pads 107 and 109.

Each body interconnect structure 104 may include the body interconnect layers 103 formed in the body 101 and the body via 105 connecting the body interconnect layers 103 to each other. The first and second body interconnect pads 107 and 109 may include the first body interconnect pad 107 located on the bottom surface 101b of the body 101 and the second body interconnect pad 109 located on the top surface 101a of the body 101. The first body interconnect pad 107 may be a portion of the body interconnect layer 103 positioned on the bottom surface 101b of the body 101. The second body interconnect pad 109 may be a portion of the body interconnect layer 103 positioned on the top surface 101a of the body 101.

Subsequently, the circuit board 106 having the through-hole 101h therein is attached to a tape substrate 171. The circuit board 106 is attached to the tape substrate 171 so that the second body interconnect pad 109 at a lowest level is attached to the tape substrate 171. As a result, the through-hole 101h may be located on a central portion of the tape substrate 171, and the body 101 may be located on either side portion of the tape substrate 171.

Figure 13:
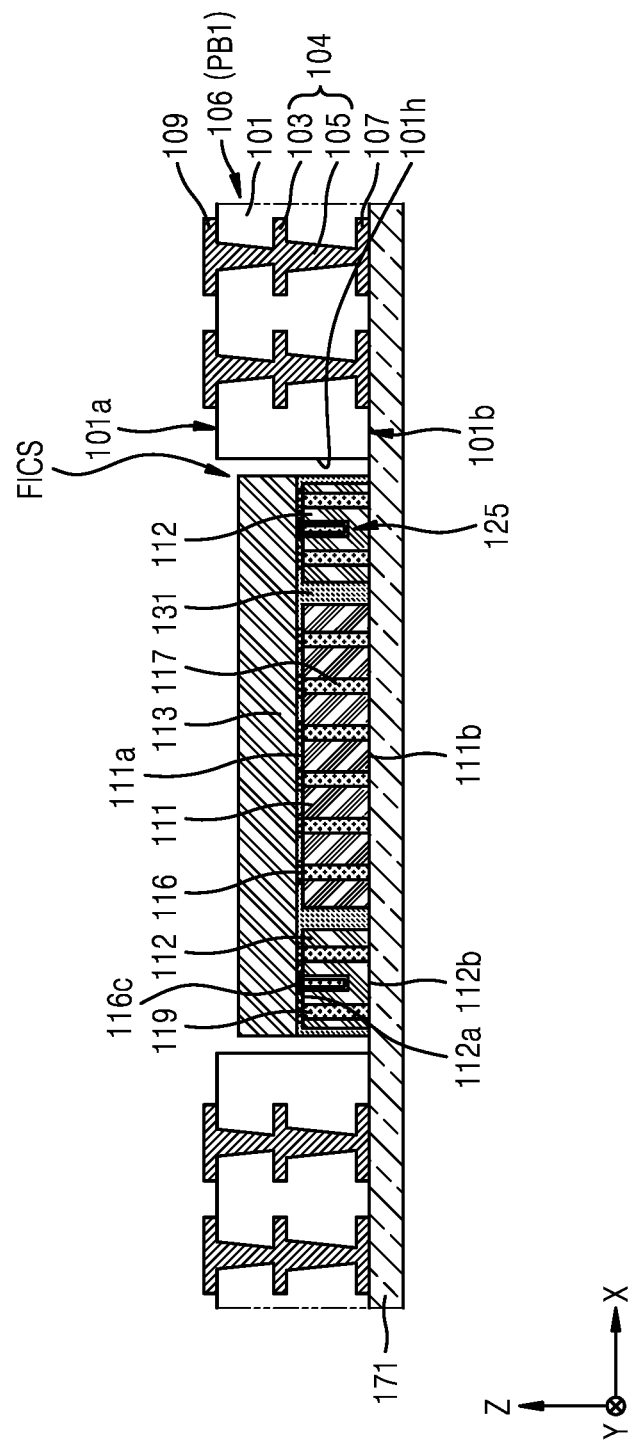

Referring to FIG. 13, the fan-in chip structure FICS of FIG. 10C is flipped over and attached to the tape substrate 171 in the through-hole 101h of the circuit board 106. The fan-in chip structure FICS is attached to the tape substrate 171 with the first and second through-vias 117 and 119 facing down in the through-hole 101h of the circuit board 106. The fan-in chip structure FICS is attached to the tape substrate 171 with the bottom surface 111b of the first chip 111 and the bottom surfaces 112b of the capacitor chips 112 facing down.

As a result, the fan-in chip structure FICS including the first chip 111, the capacitor chips 112 positioned at either side of the first chip 111, and the second chip 113 positioned on all of the first chip 111 and the capacitor chips 112 may be located in the through-hole 101h. A top surface of the fan-in chip structure FICS may be at a lower level than the top surface 101a of the body 101 constituting the circuit board 106.

When the fan-in chip structure FICS is attached to the tape substrate 171, the fan-in chip structure FICS may be positioned to be spaced apart from one side of the circuit board 106. When the fan-in chip structure FICS is apart from the circuit board 106, a surface of the tape substrate 171 may be exposed.

Figure 14:
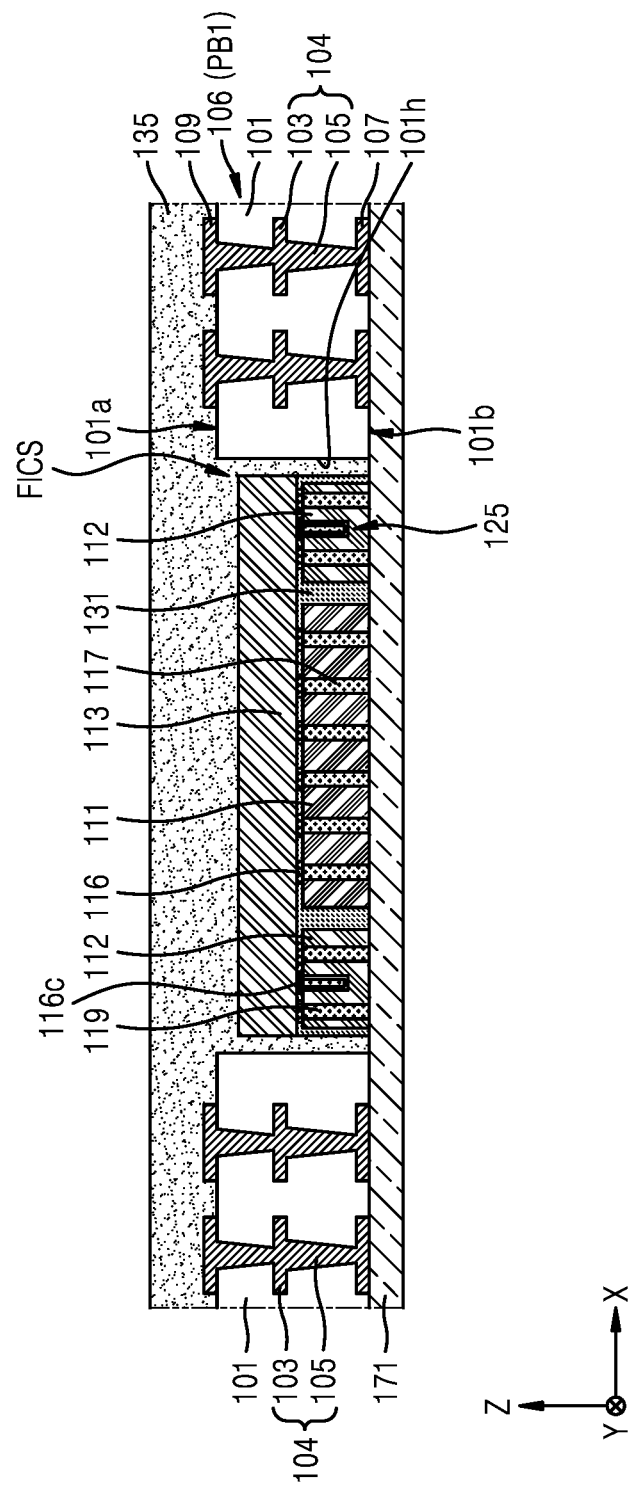

Referring to FIG. 14, the second encapsulation layer 135 is formed on the tape substrate 171 to seal the fan-in chip structure FICS and the circuit board 106. The second encapsulation layer 135 is thick enough in the Z direction to sufficiently seal the fan-in chip structure FICS and the circuit board 106. The second encapsulation layer 135 is formed to be thicker in the Z direction than the body 101 to cover the top surface 101a of the body 101.

Figure 15:
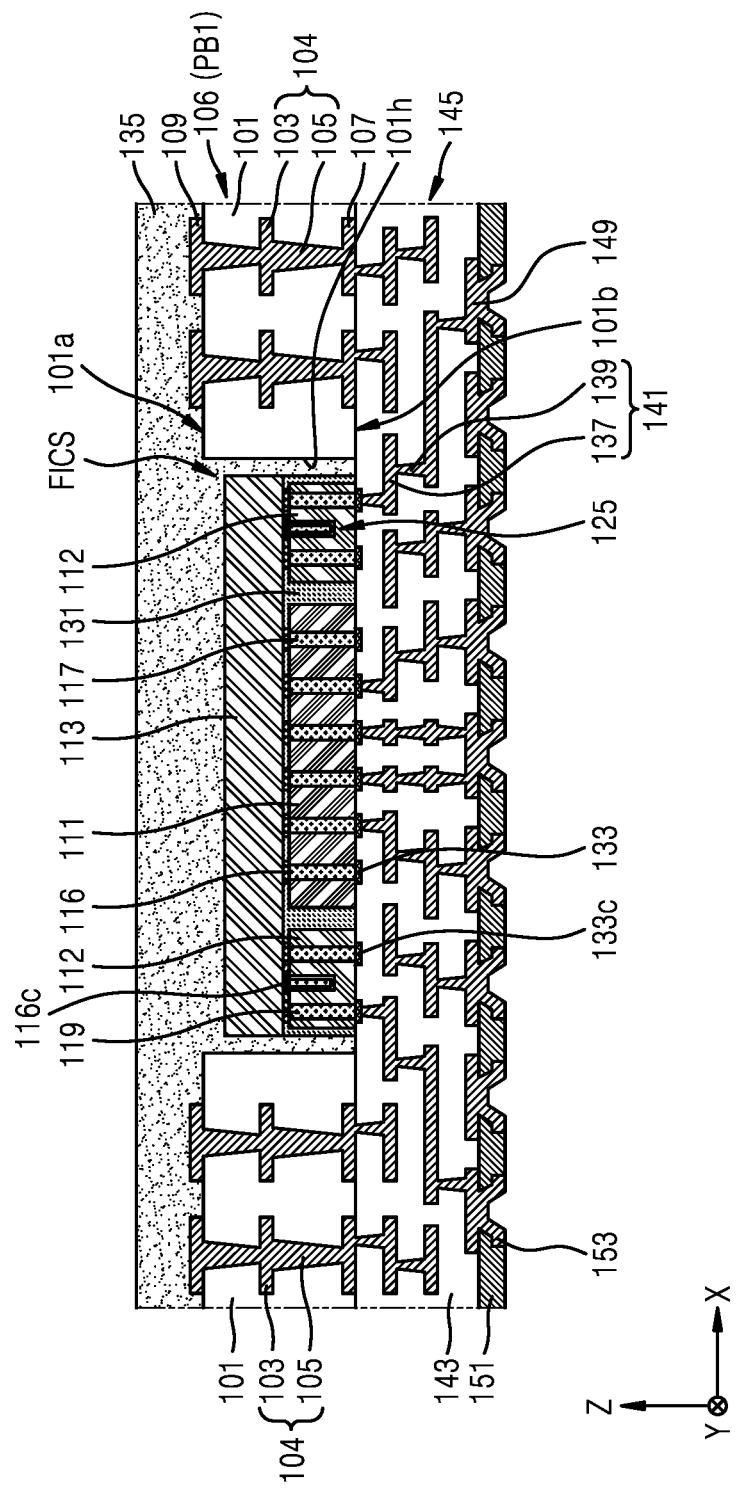

Referring to FIG. 15, the tape substrate (e.g., tape substrate 171 of FIG. 13) is removed. Subsequently, the redistribution structure 145 is formed below the first chip 111 and the capacitor chips 112 constituting the fan-in chip structure FICS and the circuit board 106. The redistribution structure 145 may be disposed on the bottom surface 101b of the circuit board 106 and a bottom surface of the fan-in chip structure FICS.

The redistribution structure 145 may include the chip connection pads 133, the lower capacitor chip connection pads 133c, the redistribution insulating layer 143, the redistribution elements 141, and the redistribution pads 149. Each redistribution element 141 may include the redistribution layer 137 and the redistribution via 139 connecting the redistribution layer 137.

The redistribution element 141 may be electrically connected to the chip connection pad 133. The redistribution element 141 may be electrically connected to the lower capacitor chip connection pad 133c. As described above, the redistribution structure 145 may extend to the fan-out area (e.g., fan-out area FO of FIG. 1) to be electrically connected to the first body interconnect pads 107.

The redistribution pads 149 may be electrically connected to the redistribution structure 145. The redistribution pad 149 may be a portion of the redistribution layer 137 positioned on the top surface of the redistribution insulating layer 143. Subsequently, the barrier metal layer 153 isolated by the first passivation layer 151 may be formed on the redistribution pad 149. The first passivation layer 151 is formed as an insulating layer, for example, an oxide layer or a nitride layer.

Figure 16:
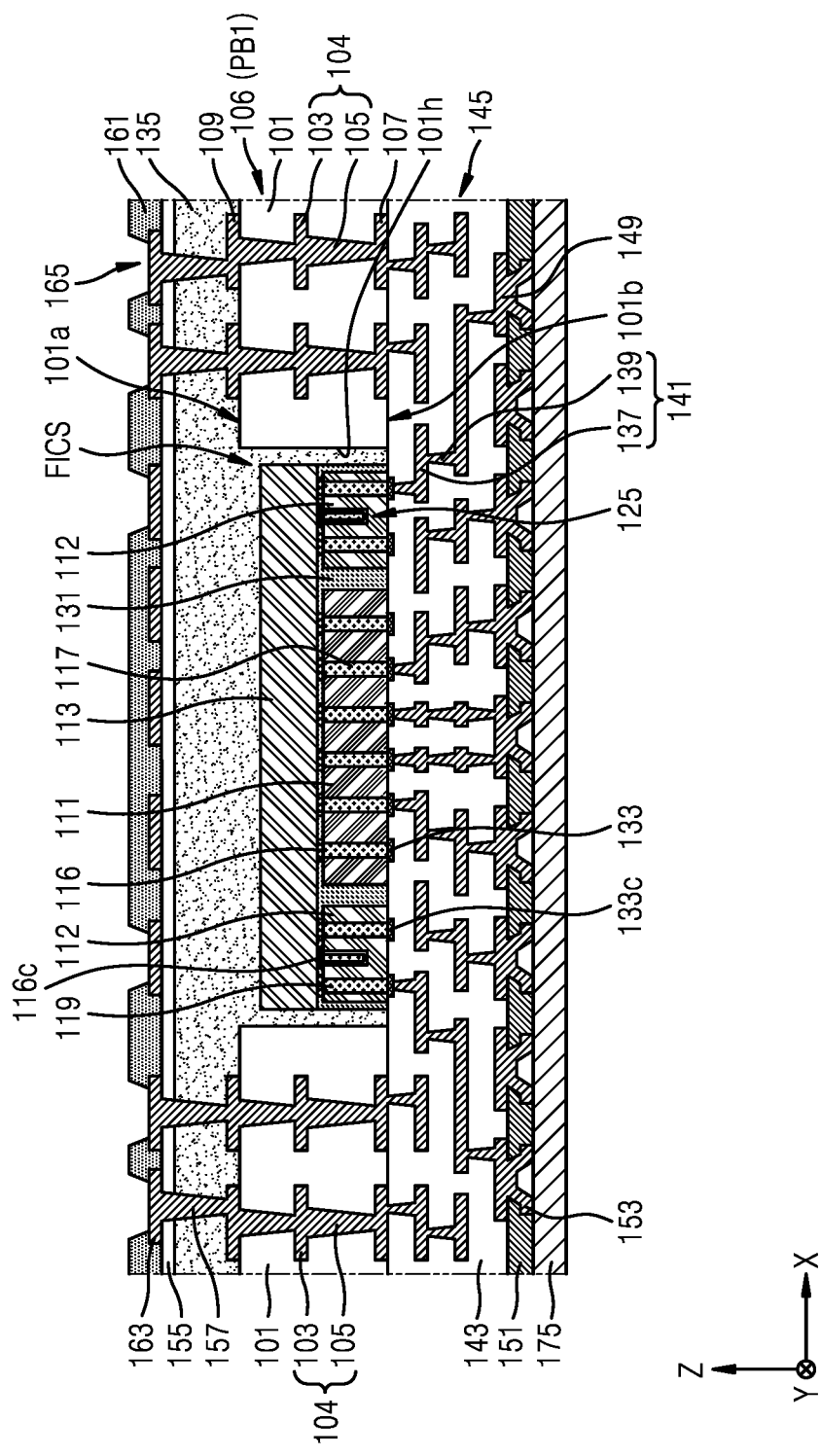

Referring to FIG. 16, a second carrier substrate 175 is attached to the barrier metal layer 153 and the first passivation layer 151. The second carrier substrate 175 may be an insulating substrate or a semiconductor substrate.

The interconnect vias 157 are formed in the second encapsulation layer 135 on the top surface 101a of the circuit board 106. The interconnect vias 157 may be insulated by the insulating layer 155. In the fan-out area FO, the interconnect via 157 is formed on the second body interconnect pad 109 in the second encapsulation layer 135. The interconnect pads 163 electrically connected to the interconnect vias 157 may be formed in the fan-out area FO.

The interconnect pads 163 may be formed in the fan-in area (e.g., fan-in area FI of FIG. 1) and the fan-out area FO. The interconnect pads 163 may be electrically isolated by the second passivation layer 161. The interconnect pad 163 may be exposed to outside through the pad exposure hole 165.

Subsequently, after removing the second carrier substrate 175, when the first external connection terminals 167 such as solder balls are formed on the barrier metal layer 153, the fan-out semiconductor package 100 of FIGS. 1 and 2 may be manufactured.

FIGS. 17 through 20 are cross-sectional views of main parts for explaining a method of manufacturing the fan-out semiconductor package 100-4 of FIG. 8, according to an example embodiment.

In detail, FIGS. 17 through 20 illustrate a method of manufacturing the fan-out semiconductor package 100-4 of FIG. 8. In the method of FIGS. 17 through 20, the redistribution structure 145 and the fan-in chip structure FICS may be arranged in a different order than that in the method described with reference to FIGS. 12 through 16. In FIGS. 17 through 20, the same or similar reference numerals as those of FIGS. 12 through 16 denote the same or similar elements. Descriptions that are already provided above with respect to FIGS. 12 through 16 will be briefly given or omitted below.

Figure 17:
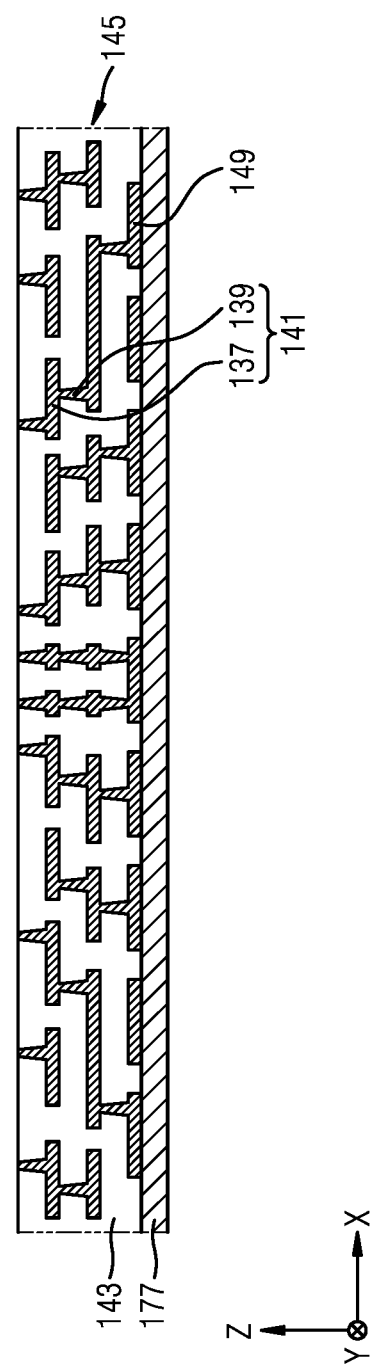
FIGS. 17 through 20 are cross-sectional views of main parts for explaining a method of manufacturing the fan-out semiconductor package of FIG. 8, according to an example embodiment.

Referring to FIG. 17, the redistribution structure 145 is formed on a carrier substrate 177. The carrier substrate 177 may be an insulating substrate or a semiconductor substrate. As described above, the redistribution structure 145 may include the redistribution insulating layer 143, the redistribution elements 141, and the redistribution pads 149. Each redistribution element 141 may include the redistribution layers 137 and the redistribution vias 139 connecting the redistribution layers 137.

The redistribution pads 149 may be electrically connected to the redistribution structure 145. The redistribution pad 149 may be a portion of the redistribution layer 137 positioned on the top surface of the redistribution insulating layer 143.

Figure 18:
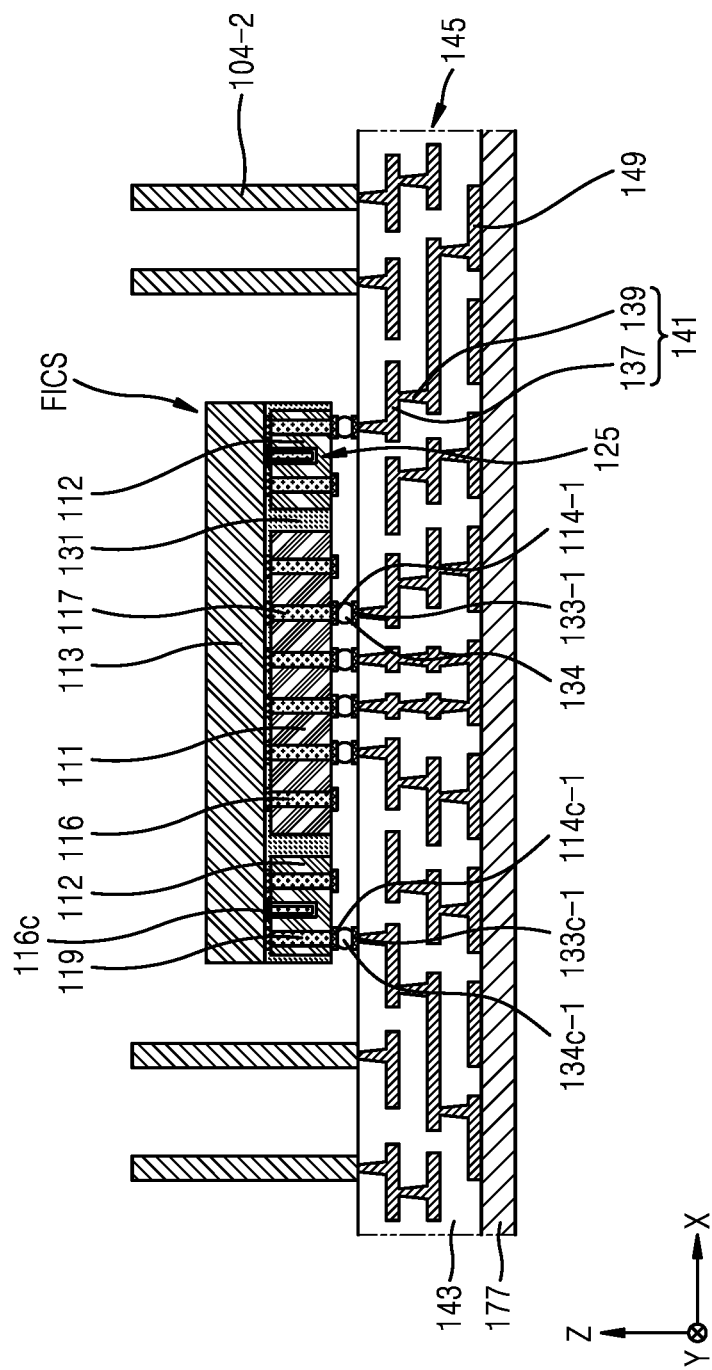

Referring to FIG. 18, the chip connection pads 133-1 and the lower capacitor chip connection pads 133c-1 are formed on the redistribution structure 145. The intermediate solder balls 134 are formed on the chip connection pad 133-1, and the intermediate solder balls 134c-1 are formed on the lower capacitor chip connection pads 133c-1.

The first chip 111 including the lower first chip pads 114-1, the capacitor chips 112 including the lower capacitor chip pads 114c-1, and the fan-in chip structure FICS including the first chip 111 and the capacitor chips 112 are prepared.

Then, the fan-in chip structure FICS is mounted on the intermediate solder balls 134 and 134c-1. Accordingly, the chip connection pads 133-1 may be electrically connected to the lower first chip pads 114-1 using the intermediate solder balls 134. The lower capacitor chip connection pads 133c-1 may be electrically connected to the lower capacitor chip pads 114c-1 using the intermediate solder balls 134c-1.

Subsequently, the body interconnect structures 104-2 are formed on the redistribution structure 145. The body interconnect structures 104-2 may be formed in the fan-out area (e.g., fan-out area FO of FIG. 6) as shown in FIG. 8. Each body interconnect structure 104-2 may be formed of a metal post, for example, a Cu post. The body interconnect structures 104-2 may be electrically connected to the redistribution structure 145.

Figure 19:
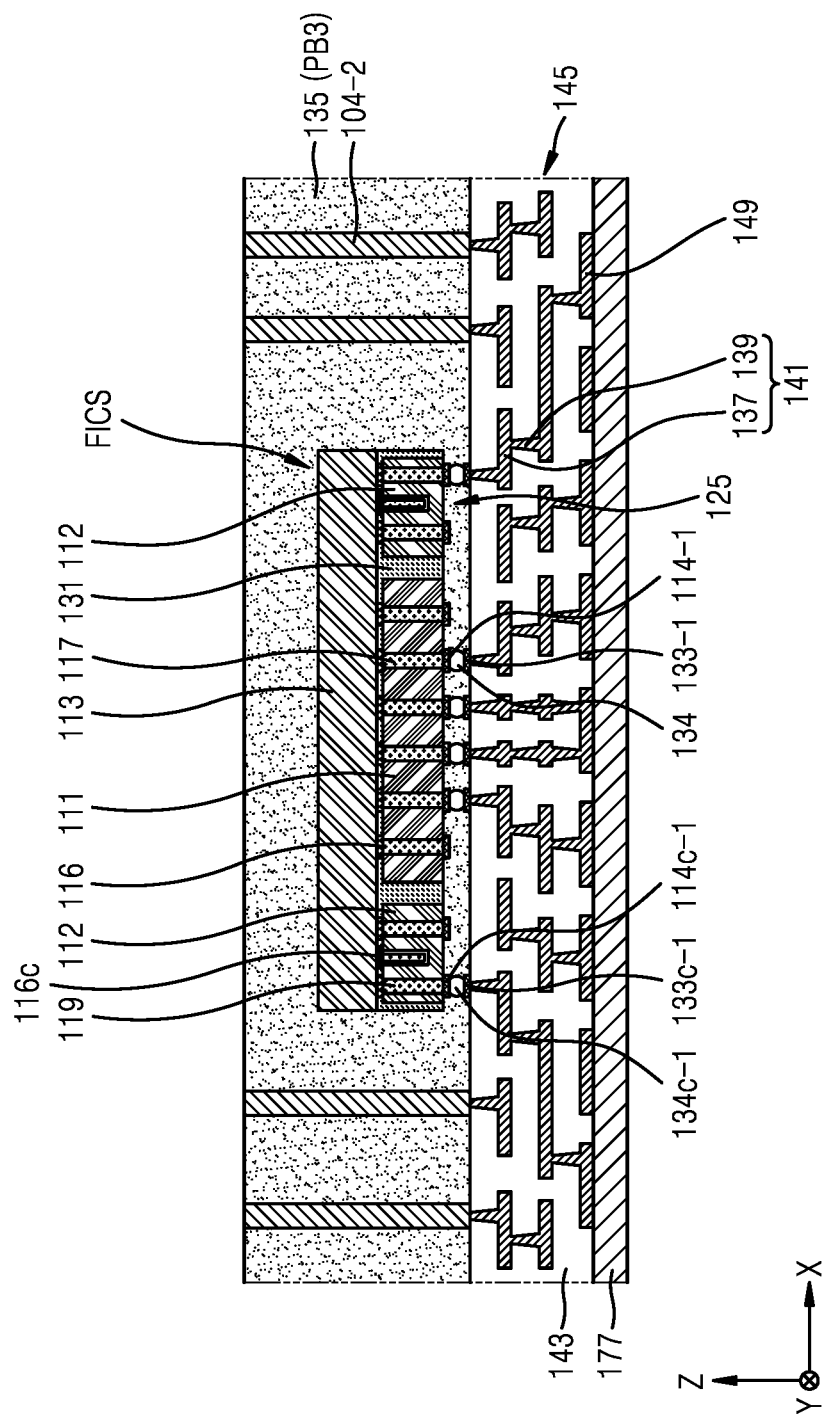

Referring to FIG. 19, the second encapsulation layer 135 is thick enough to sufficiently seal the fan-in chip structure FICS and the body interconnect structures 104-2 on the redistribution structure 145. The second encapsulation layer 135 may constitute the package body PB3. In some embodiments, the second encapsulation layer 135 may be in the same plane as the body interconnect structure 104-2 using a planarization process.

Figure 20:
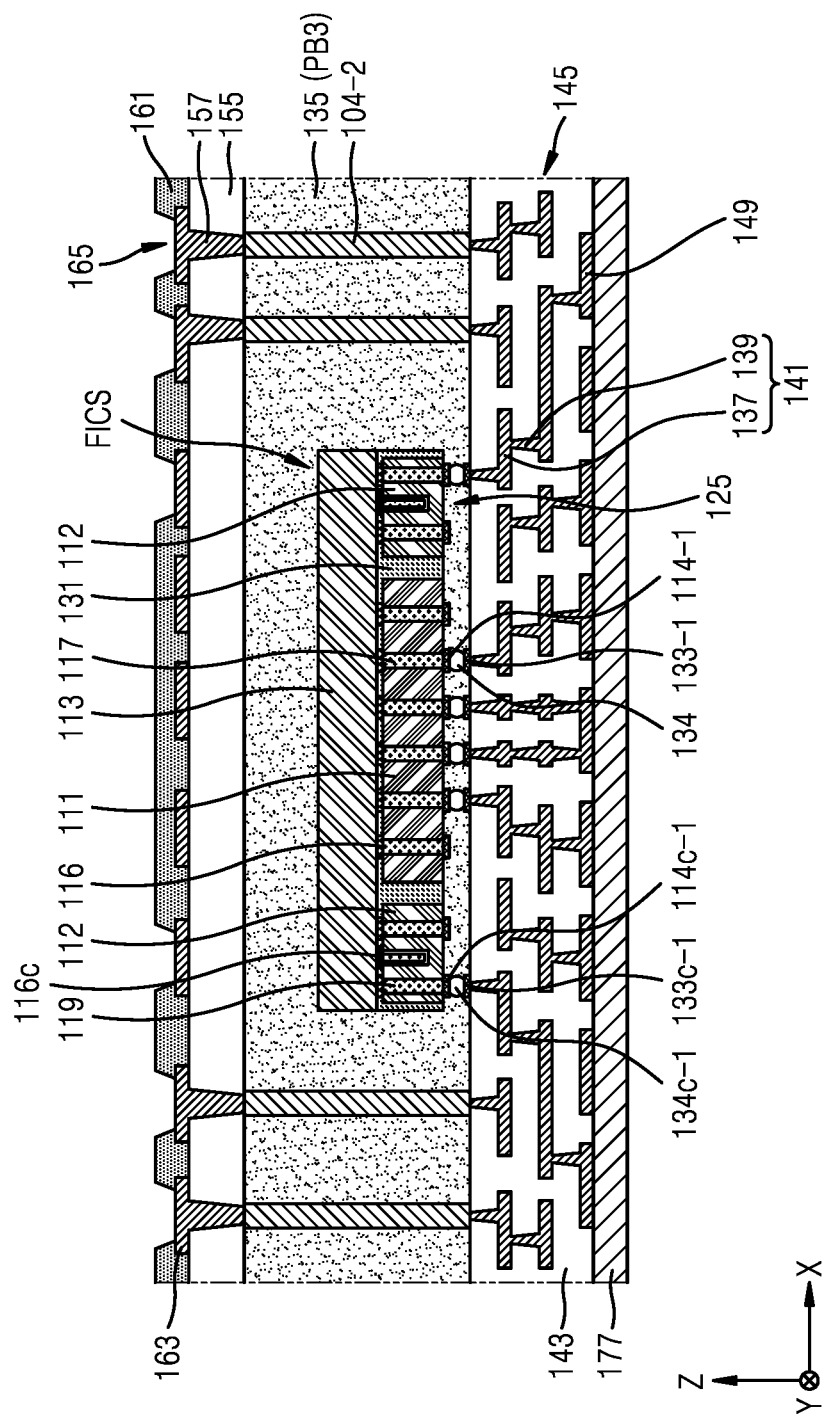

Referring to FIG. 20, the interconnect vias 157 insulated by the insulating layer 155 are formed on the second encapsulation layer 135 and the body interconnect structures 104-2. The interconnect pads 163 insulated by the second passivation layer 161 are formed on the interconnect vias 157. The interconnect pads 163 may be electrically isolated by the second passivation layer 161. The interconnect pads 163 may be exposed to an outside through the pad exposure holes 165.

Subsequently, after removing the carrier substrate 177, the barrier metal layer 153 isolated by the first passivation layer 151 is formed on the redistribution pads 149 as shown in FIG. 8. The fan-out semiconductor package 100-4 may be manufactured by forming the first external connection terminals 167 such as solder balls on the barrier metal layer 153.

Figure 21:
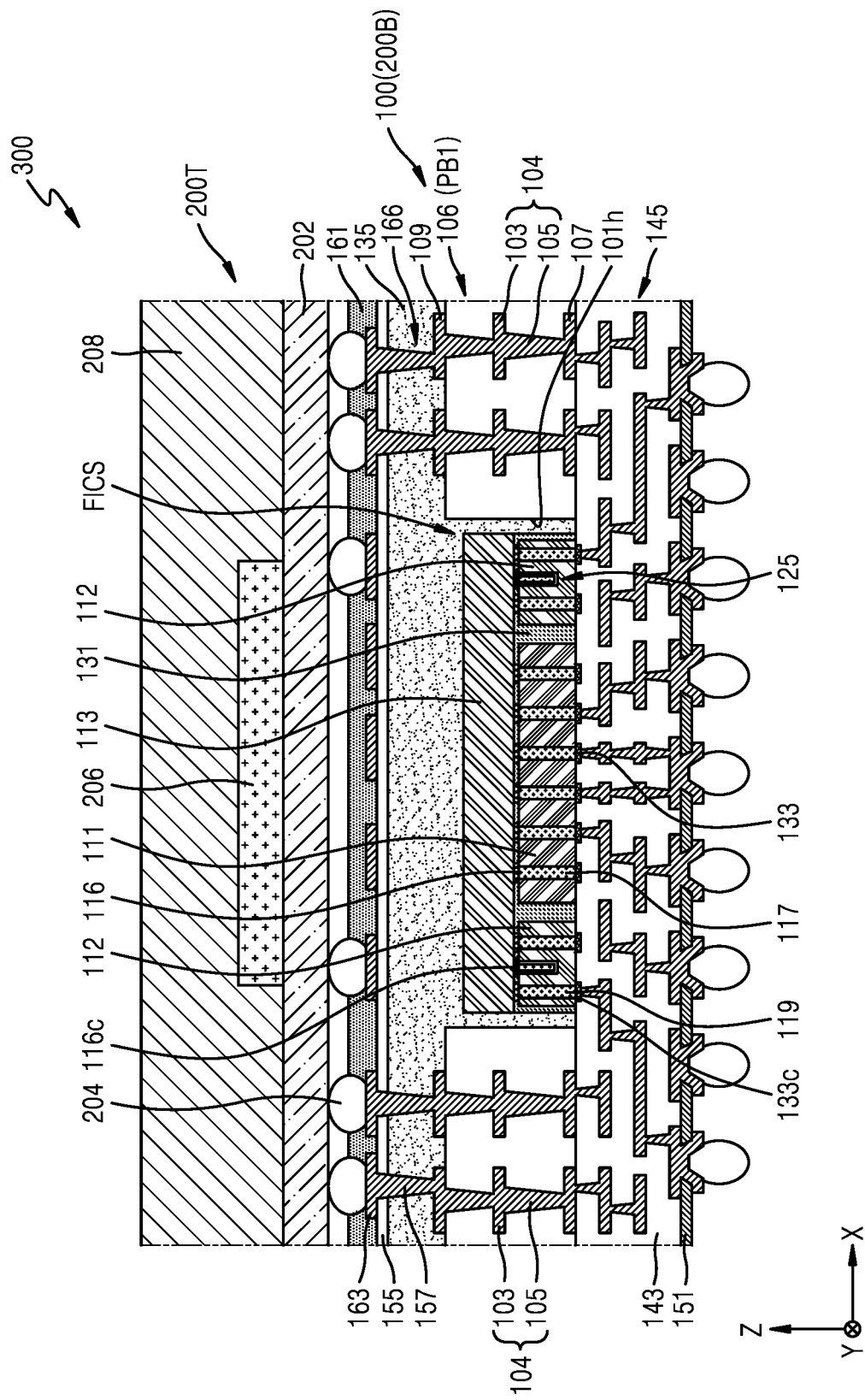
FIG. 21 is a cross-sectional view of a main part of a fan-out semiconductor package, according to an example embodiment of the inventive concept.

FIG. 21 is a cross-sectional view of a main part of a fan-out semiconductor package 300 according to an example embodiment of the inventive concept.

In detail, the fan-out semiconductor package 300 may be substantially the same as the fan-out semiconductor package 100 of FIGS. 1 and 2 except that an upper package 200T is further stacked on the fan-out semiconductor package 100. In FIG. 21, descriptions of elements represented by the same reference numerals as those of FIGS. 1 and 2 will be briefly given or omitted below. Here, the fan-out semiconductor package 100 of FIGS. 1 and 2 is referred to as a lower package 200B.

The fan-out semiconductor package 300 may be a stack package including the lower package 200B and the upper package 200T. Second external connection terminals 204 such as second solder balls may be formed on the interconnect pads 163 of the lower package 200B. The upper package 200T may be attached to the second external connection terminals 204.

The upper package 200T may include an upper chip 206 attached to an upper circuit board 202. The upper circuit board 202 may be electrically connected to the upper chip 206 through bonding wires or bumps. In FIG. 21, the upper chip 206 may be connected to the upper circuit board 202 via bumps (not shown). The upper chip 206 may be a memory chip. Examples of the memory chip may be as described above.

The upper package 200T may include an upper encapsulation layer 208 enclosing at least a portion of the upper chip 206. For example, the upper encapsulation layer 208 may be formed of EMC. Although FIG. 21 shows that the upper encapsulation layer 208 covers an inactive surface (a top surface) of the upper chip 206, embodiments are not limited thereto.

Figure 22:
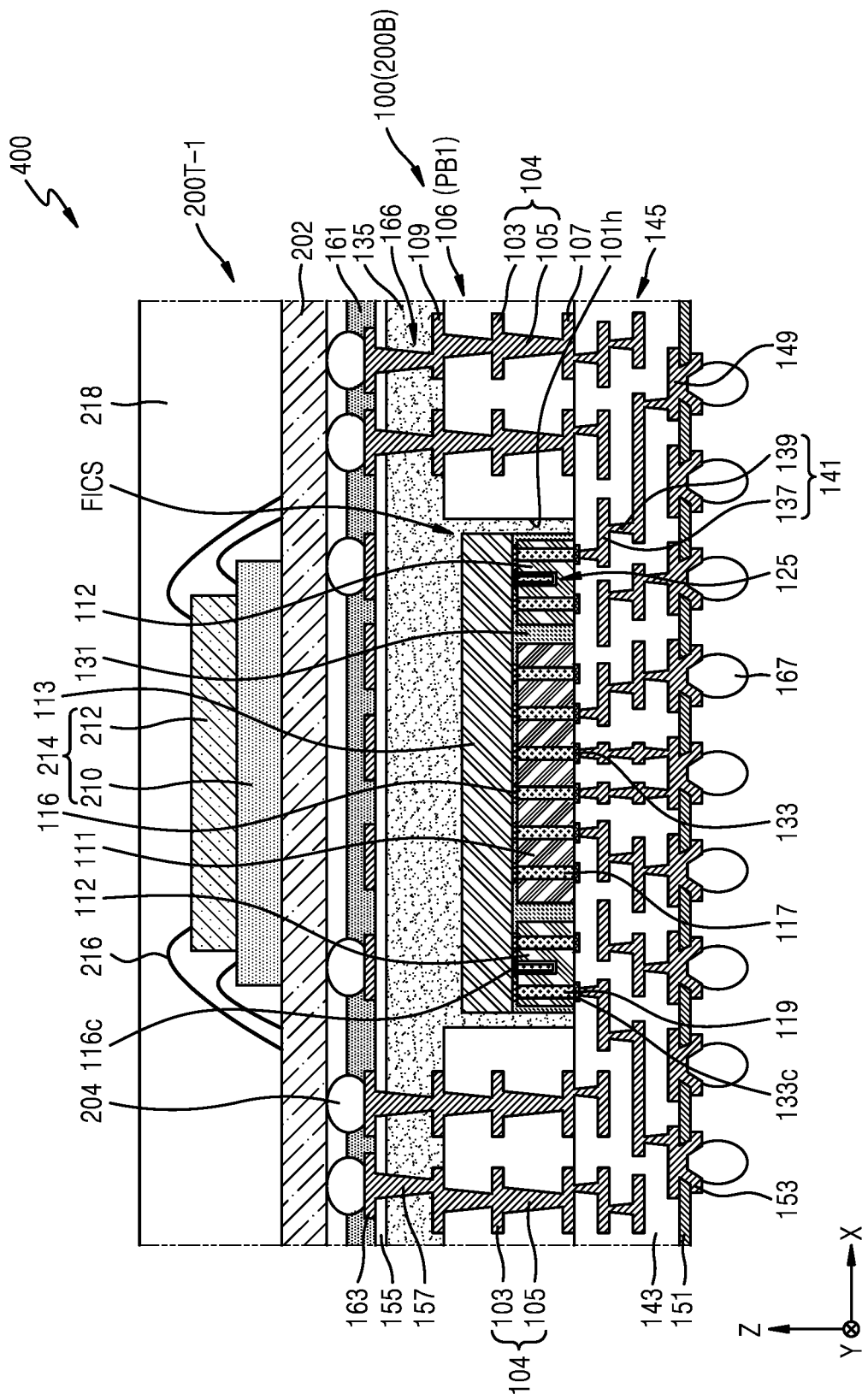
FIG. 22 is a cross-sectional view of a main part of a fan-out semiconductor package, according to an example embodiment of the inventive concept.

FIG. 22 is a cross-sectional view of a main part of a fan-out semiconductor package 400 according to an example embodiment of the inventive concept.

In detail, the fan-out semiconductor package 400 may be substantially the same as the fan-out semiconductor package 300 of FIG. 21 except that the fan-out semiconductor package 400 is a stack package including an upper package 200T-1 having a plurality of upper chips 214. In FIG. 22, descriptions of elements represented by same reference numerals as those of FIG. 21 will be briefly given or omitted below. Here, the fan-out semiconductor package 100 is referred to as a lower package 200B.

The fan-out semiconductor package 400 may be a stack package including the lower package 200B and the upper package 200T-1. The second external connection terminals 204 such as second solder balls may be arranged on the interconnect pads 163 of the lower package 200B. The upper package 200T-1 may be attached to the second external connection terminals 204.

The upper package 200T-1 may include the upper chips 214 attached to an upper circuit board 202. The upper chips 214 may include a first upper chip 210 and a second upper chip 212. The first and second upper chips 210 and 212 may be connected to the upper circuit board 202 via bonding wires 216. The upper chips 214 may include a memory chip or a controller chip. The upper package 200T-1 may include an upper encapsulation layer 218 enclosing at least portions of the upper chips 214.

Figure 23:
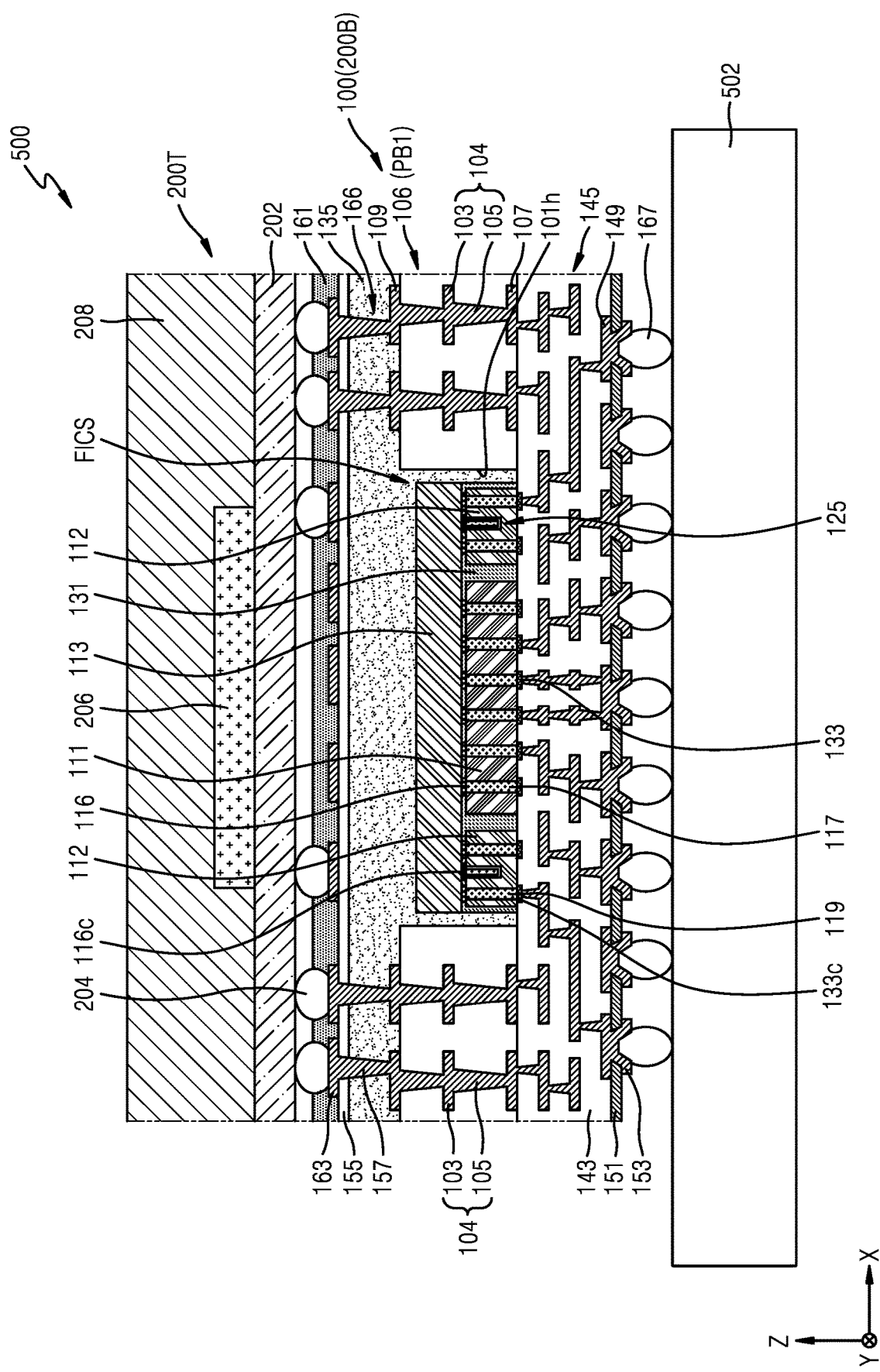
FIG. 23 is a cross-sectional view of a main part of a fan-out semiconductor package, according to an example embodiment of the inventive concept.

FIG. 23 is a cross-sectional view of a main part of a fan-out semiconductor package 500 according to an example embodiment of the inventive concept.

In detail, the fan-out semiconductor package 500 may be substantially the same as the fan-out semiconductor package 300 of FIG. 21, except that the lower package 200B is attached to a motherboard substrate 502. In FIG. 23, descriptions of elements represented by the same reference numerals as those of FIG. 21 will be briefly given or omitted below. Here, the fan-out semiconductor package 100 is referred to as a lower package 200B.

The fan-out semiconductor package 500 may be a stack package including the motherboard substrate 502, the lower package 200B, and the upper package 200T. The first external connection terminals 167 of the lower package 200B may be mounted on the motherboard substrate 502.

The motherboard substrate 502 may be a PCB. A plurality of additional semiconductor packages or passive devices may be mounted on the motherboard substrate 502.

Figure 24:
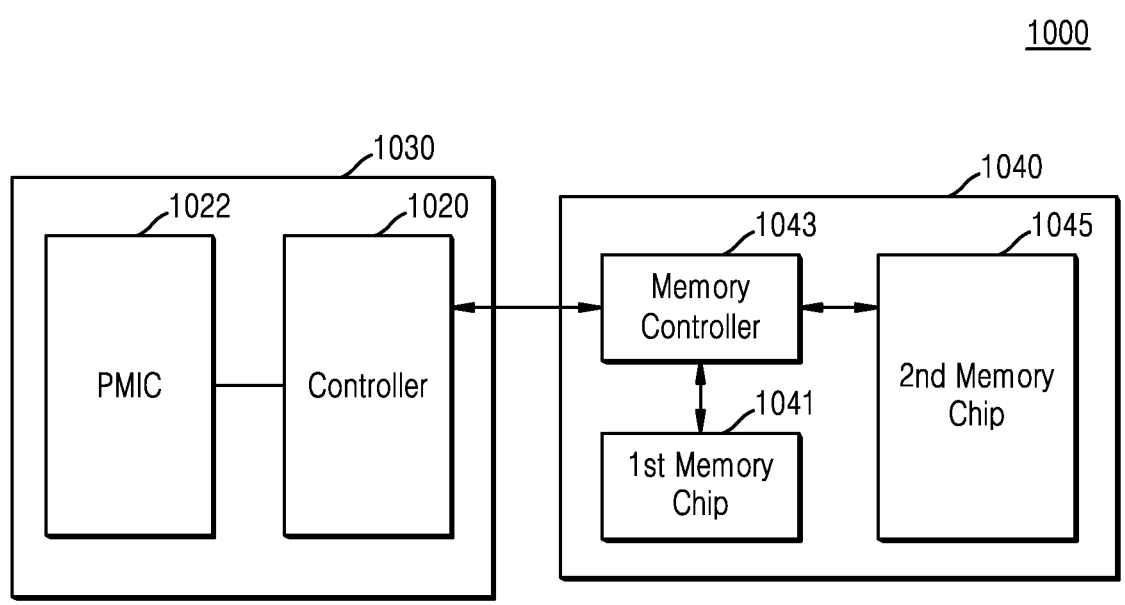
FIG. 24 is a block diagram of a configuration of a fan-out semiconductor package, according to an example embodiment of the inventive concept.

FIG. 24 is a block diagram of a configuration of a fan-out semiconductor package 1000 according to an example embodiment of the inventive concept.

In detail, the fan-out semiconductor package 1000 may correspond to the fan-out semiconductor package 300, 400, or 500 according to the inventive concept. The fan-out semiconductor package 1000 may include a controller chip 1020, a first memory chip 1041, a second memory chip 1045, and a memory controller 1043. The fan-out semiconductor package 1000 may further include a power management integrated circuit (PMIC) 1022 for supplying current of an operating voltage to each of the controller chip 1020, the first memory chip 1041, the second memory chip 1045, and the memory controller 1043. An operating voltage applied to each of components may be designed to be equal or different.

A lower package 1030 including the controller chip 1020 and the PMIC 1022 may be the lower package 200B of the inventive concept described above. An upper package 1040 including the first memory chip 1041, the second memory chip 1045, and the memory controller 1043 may be the upper package 200T or 200T-1 of the inventive concept described above.

The fan-out semiconductor package 1000 may be implemented to be included in a personal computer (PC) or a mobile device. The mobile device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal or portable navigation device (PND), a handheld game console, a mobile Internet device (MID), a wearable computer, an Internet of Things (IoT) device, an Internet of Everything (IoE) device, or a drone.

The controller chip 1020 may control an operation of each of the first memory chip 1041, the second memory chip 1045, and the memory controller 1043. For example, the controller chip 1020 may be implemented as an integrated circuit (IC), a system on chip (SoC), an AP, a mobile AP, a chipset, or a set of chips. The controller chip 1020 may include a CPU, a GPU, and/or a modem. In some embodiments, the controller chip 1020 may perform functions of the modem and the AP.

The memory controller 1043 may control the second memory chip 1045 according to control by the controller chip 1020. The first memory chip 1041 may be implemented as a volatile memory device. The volatile memory device may be implemented as RAM, DRAM, or SRAM, but embodiments are not limited thereto. The second memory chip 1045 may be implemented as a storage memory device. The storage memory device may be implemented as a nonvolatile memory device.

The storage memory device may be implemented as a flash-based memory device, but embodiments are not limited thereto. The second memory chip 1045 may be implemented as a NAND-type flash memory device. The NAND-type flash memory device may include a two-dimensional (2D) or three-dimensional (3D) memory cell array. The 2D or 3D memory cell array may include a plurality of memory cells, and each of the plurality of memory cells may store 1-bit information or 2-bit or more information.

When the second memory chip 1045 is implemented as a flash-based memory device, the memory controller 1043 may use (or support) a multimedia card (MMC) interface, an embedded MMC (eMMC) interface, or a universal flash storage (UFS) interface, but embodiments are not limited thereto.

Figure 25:
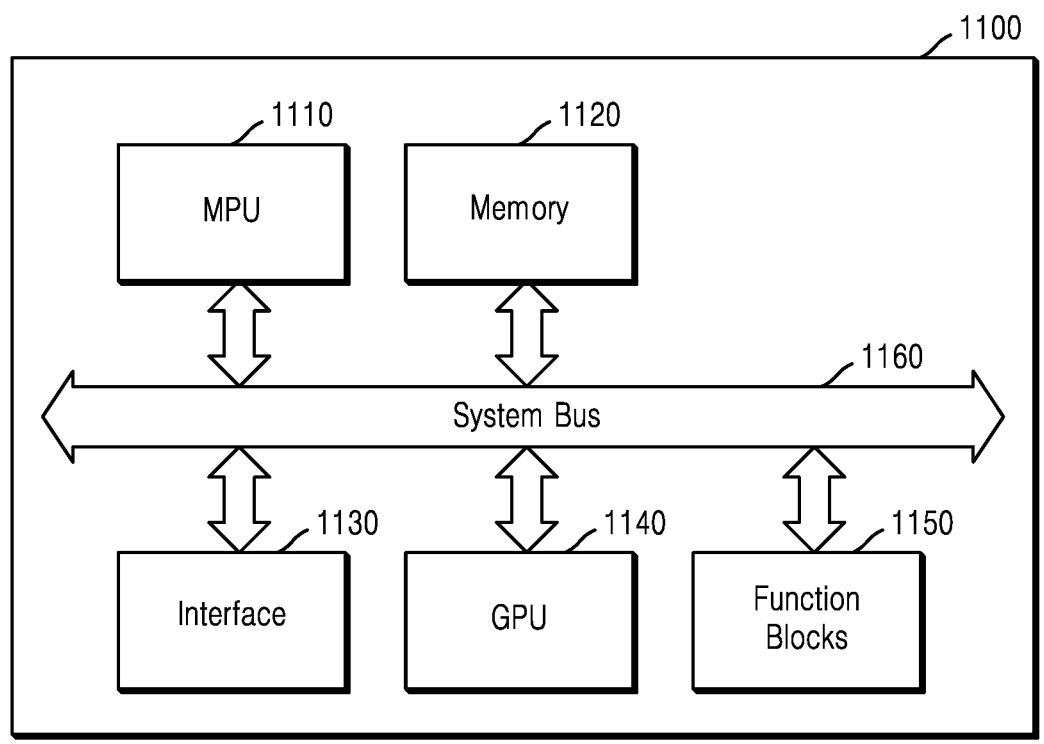
FIG. 25 is a schematic block diagram of a configuration of a fan-out semiconductor package, according to an example embodiment of the inventive concept.

FIG. 25 is a schematic block diagram of a configuration of a fan-out semiconductor package 1100 according to an example embodiment of the inventive concept.

In detail, the fan-out semiconductor package 1100 may include a microprocessor unit (MPU) 1110, memory 1120, an interface 1130, a GPU 1140, function blocks 1150, and a system bus 1160 for connecting them. The fan-out semiconductor package 1100 may include both the MPU 1110 and the GPU 1140 or may include only one of them.

The MPU 1110 may include a core and a level 2 (L2) cache. For example, the MPU 1110 may include multiple cores. Each of the multiple cores may have the same or different functions. Also, the multiple cores may be activated simultaneously or at different times. The memory 1120 may store a result of processing on the function blocks 1150 according to control by the MPU 1110. For example, as contents stored in the L2 cache of the MPU 1110 are flushed, the contents may be stored in the memory 1120. The interface 1130 may perform an interface with external devices. For example, the interface 1130 may perform an interface with a camera, a liquid crystal display (LCD), and a speaker device.

The GPU 1140 may perform graphics processing functions. For example, the GPU 1140 may perform video encoding/decoding or may process 3D graphics. The function blocks 1150 may perform various functions. For example, when the fan-out semiconductor package 1100 is an AP used in a mobile device, some of the function blocks 1150 may perform communication functions.

The fan-out semiconductor package 1100 may be the fan-out semiconductor package 300, 400, or 500 described above. The MPU 1110 and/or the GPU 1140 may be the lower package 200B described above. The memory 1120 may be the upper package 200T or 200T-1 described above. The interface 1130 and the function blocks 1150 may correspond to a part of the lower package 200B described above.

Although example embodiments have been described using specific terms in the present specification, these are used only for the purpose of explaining the technical spirit of the inventive concept, and are not used to limit the meaning or the scope of the inventive concept set forth in the claims.

While the inventive concept has been particularly shown and described with reference to example embodiments thereof, it will be understood that various changes in form and details may be made therein and equivalent other embodiments are possible therefrom without departing from the spirit and scope of the following claims.

What is claimed is:

1. A fan-out semiconductor package comprising:
a package body including a fan-in area corresponding to a through-hole located therein, a fan-out area surrounding the fan-in area, and a body interconnect structure arranged in the package body corresponding to the fan-out area;
a fan-in chip structure located in the through-hole, the fan-in chip structure including a first chip, a capacitor chip arranged to be spaced apart from the first chip, and a second chip disposed on both the first chip and the capacitor chip;
a redistribution structure arranged on a bottom surface of the package body and a bottom surface of the fan-in chip structure and including a redistribution element extending to the fan-out area; and
an interconnect via arranged on a top surface of the package body and electrically connected to the redistribution element in the fan-out area.

2. The fan-out semiconductor package of claim 1, wherein the package body includes a circuit board, and the circuit board includes an insulating substrate or a semiconductor substrate.

3. The fan-out semiconductor package of claim 1, wherein the capacitor chip includes a trench capacitor or a through-via capacitor.

4. The fan-out semiconductor package of claim 1,
wherein a second chip pad is arranged on a bottom surface of the second chip,
wherein chip connection pads are arranged on bottom surfaces of the capacitor chip and the first chip, and
wherein the second chip pad has a different structure than the chip connection pads.

5. The fan-out semiconductor package of claim 1,
wherein the second chip includes a second chip pad,
wherein the first chip includes a first through-via,
wherein the capacitor chip includes a second through-via, and
wherein the second chip pad is electrically connected to the first and second through-vias.

6. The fan-out semiconductor package of claim 1,
wherein the first chip includes a first through-via,
wherein the capacitor chip includes a second through-via, and
wherein the redistribution structure includes a chip connection pad connected to the first and second through-vias.

7. The fan-out semiconductor package of claim 1,
wherein the first chip includes a first through-via and a first chip pad connected to the first through-via,
wherein the redistribution structure further includes a chip connection pad, and
wherein the first chip pad is electrically connected to the redistribution element through the chip connection pad.

8. The fan-out semiconductor package of claim 1,
wherein the capacitor chip includes a second through-via and a capacitor chip pad connected to the second through-via, wherein the redistribution structure further includes a chip connection pad, and
wherein the capacitor chip pad is electrically connected to the redistribution element through the chip connection pad.

9. The fan-out semiconductor package of claim 1,
wherein the package body is formed as a circuit board having the through-hole located therein,
wherein the fan-in chip structure further includes a first encapsulation layer located between the first chip and the capacitor chip, and
wherein the fan-out semiconductor package further includes a second encapsulation layer sealing the fan-in chip structure embedded in the through-hole.

10. The fan-out semiconductor package of claim 1,
wherein the package body is formed as a circuit board having the through-hole located therein,
wherein the package body includes the body interconnect structure arranged therein, a first body interconnect pad located on a bottom surface of the package body and electrically connected to the body interconnect structure, and a second body interconnect pad located on a top surface thereof and electrically connected to the body interconnect structure,
wherein the redistribution structure is electrically connected to the first body interconnect pad in the fan-out area, and
wherein the interconnect via is electrically connected to the second body interconnect pad in the fan-out area.

11. The fan-out semiconductor package of claim 1, wherein the package body includes an encapsulation layer that seals the fan-in chip structure located in the fan-in area and is formed in the fan-out area.

12. A fan-out semiconductor package comprising:
a package body including a fan-in area corresponding to a through-hole located therein, a fan-out area surrounding the fan-in area, and a body interconnect structure arranged in the package body corresponding to the fan-out area;
a fan-in chip structure located in the through-hole, the fan-in chip structure including a first chip, a capacitor chip arranged to be spaced apart from the first chip, a first encapsulation layer located between the first chip and the capacitor chip, and a second chip having a top surface bonded to top surfaces of both the first chip and the capacitor chip;
a redistribution structure arranged on a bottom surface of the package body and a bottom surface of the first chip and including a redistribution element extending to the fan-out area; and
an interconnect via arranged on a top surface of the package body and electrically connected to the redistribution element in the fan-out area.

13. The fan-out semiconductor package of claim 12,
wherein the top surfaces of the first chip, the capacitor chip, and the second chip are active surfaces, and
wherein the bottom surface of the first chip and bottom surfaces of the capacitor chip and the second chip are inactive surfaces.

14. The fan-out semiconductor package of claim 12,
wherein the package body is a circuit board having the through-hole located therein, and
wherein the fan-out semiconductor package further comprises a second encapsulation layer formed on both sides of the fan-in chip structure within the through-hole and on the package body.

15. The fan-out semiconductor package of claim 12, wherein the capacitor chip includes a trench capacitor or a through-via capacitor.

16. The fan-out semiconductor package of claim 12, wherein the first chip and the capacitor chip are arranged to overlap the second chip in a planar view.

17. The fan-out semiconductor package of claim 12,
wherein the package body further includes a second encapsulation layer that seals the fan-in chip structure located in the fan-in area and is formed in the fan-out area, and
wherein the body interconnect structure is located in the second encapsulation layer and is electrically connected to the redistribution structure and the interconnect via.

18. A fan-out semiconductor package comprising:
a lower package; and
an upper package stacked on the lower package;
wherein the lower package comprises:
a package body including a fan-in area corresponding to a through-hole located therein, a fan-out area surrounding the fan-in area, and a body interconnect structure arranged in the package body corresponding to the fan-out area;
a fan-in chip structure located in the through-hole, the fan-in chip structure including a first chip, a capacitor chip arranged to be spaced apart from the first chip, and a second chip disposed on both the first chip and the capacitor chip;
a redistribution structure arranged on a bottom surface of the package body and a bottom surface of the fan-in chip structure and including a redistribution element extending to the fan-out area;
a first external connection terminal electrically connected to the redistribution structure on the bottom surface of the package body; and
an interconnect via and an interconnect pad arranged on a top surface of the package body and electrically connected to the redistribution element in the fan-out area, and
wherein the upper package comprises:
an upper circuit board;
an upper semiconductor chip mounted on the upper circuit board; and
a second external connection terminal arranged on a bottom surface of the upper circuit board and electrically connected to the interconnect pad of the lower package.

19. The fan-out semiconductor package of claim 18,
wherein the package body includes the body interconnect structure including a body via layer, and
wherein an upper portion of the body interconnect structure has a width equal to that of a lower portion thereof.

20. The fan-out semiconductor package of claim 18,
wherein the fan-in chip structure further includes a first encapsulation layer located between the first chip and the capacitor chip,
wherein the package body further includes a second encapsulation layer that seals the fan-in chip structure located in the fan-in area and is formed in the fan-out area, and
wherein the body interconnect structure is located in the second encapsulation layer and is electrically connected to the redistribution structure and the interconnect via.

* * * * *